(12) United States Patent
Anderson et al.

(10) Patent No.: US 10,276,558 B1
(45) Date of Patent: Apr. 30, 2019

(54) ELECTROSTATIC DISCHARGE PROTECTION USING VERTICAL FIN CMOS TECHNOLOGY

(71) Applicant: International Business Machines Corporation, Armonk, NY (US)

(72) Inventors: Brent A. Anderson, Jericho, VT (US); Huiming Bu, Glenmont, NY (US); Terence B. Hook, Jericho, VT (US); Xuefeng Liu, Schenectady, NY (US); Junli Wang, Albany, NY (US); Miaomiao Wang, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/797,119

(22) Filed: Oct. 30, 2017

(51) Int. Cl.
| | |
|---|---|
| *H01L 27/02* | (2006.01) |
| *H01L 27/12* | (2006.01) |
| *H01L 29/808* | (2006.01) |
| *H01L 27/092* | (2006.01) |
| *H01L 29/06* | (2006.01) |
| *H01L 29/78* | (2006.01) |

(52) U.S. Cl.
CPC ...... *H01L 27/0266* (2013.01); *H01L 27/0255* (2013.01); *H01L 27/0922* (2013.01); *H01L 27/1211* (2013.01); *H01L 29/06* (2013.01); *H01L 29/785* (2013.01); *H01L 29/8083* (2013.01)

(58) Field of Classification Search
CPC ... H01L 29/06; H01L 27/0255; H01L 27/1211
See application file for complete search history.

(56) References Cited

U.S. PATENT DOCUMENTS

| | | | |
|---|---|---|---|
| 4,400,712 A | 8/1983 | O'Connor | |
| 4,933,736 A * | 6/1990 | Conner | H01L 21/033 |
| | | | 257/390 |
| 5,341,005 A | 8/1994 | Canclini | |
| 7,164,566 B2 | 1/2007 | Xu et al. | |

(Continued)

FOREIGN PATENT DOCUMENTS

| | | |
|---|---|---|
| DE | 69220159 T2 | 10/1997 |
| DE | 69615443 D1 | 10/2001 |
| JP | 2004103664 A | 4/2004 |

*Primary Examiner* — Quoc Hoang
(74) *Attorney, Agent, or Firm* — Cantor Colburn LLP; Vazken Alexanian

(57) ABSTRACT

Embodiments include a method and resulting structures for vertical fin CMOS technology for electrostatic discharge protection. In a non-limiting embodiment, forming a first set of semiconductor fins vertically extending from a substrate, and forming a second set of semiconductor fins vertically extending from the substrate, the distance between the first set of fins and the second set of fins defines a length of a junction. Embodiments also include forming a first epitaxy layer on the substrate, and forming a second epitaxy layer atop a portion of the first epitaxy layer, wherein a PN junction is formed between the first epitaxy layer and the second epitaxy layer, wherein a length of the PN junction is defined by the first set of semiconductor fins and the second semiconductor fins. Embodiments include forming a first metal contact atop the first epitaxy layer, and forming a second metal contact atop the second epitaxy layer.

18 Claims, 40 Drawing Sheets

(56) References Cited

U.S. PATENT DOCUMENTS

| | | |
|---|---|---|
| 7,804,670 B2 | 9/2010 | Reynders et al. |
| 8,217,421 B2 | 7/2012 | Chen et al. |
| 9,583,586 B1 * | 2/2017 | Shi .................... H01L 29/66113 |
| 2005/0207077 A1 | 9/2005 | Xu et al. |
| 2012/0018778 A1 | 1/2012 | Chen et al. |
| 2018/0061968 A1 * | 3/2018 | Basker ................ H01L 27/0924 |

* cited by examiner

US 10,276,558 B1

ELECTROSTATIC DISCHARGE PROTECTION USING VERTICAL FIN CMOS TECHNOLOGY

BACKGROUND

The present invention generally relates to electrostatic discharge protection, and more specifically, to using vertical fin CMOS technology for electrostatic discharge protection.

Field effect transistors (FETs) have been known for a number of years and are now the transistor of choice for use in complex integrated digital circuits. In general, field effect transistors can be fabricated somewhat more simply and with larger process windows than bipolar transistors and, additionally, allow simplified circuit and device design. Constraints on transistor footprint size and current-carrying capacity are continually increasing to satisfy demands for higher digital switching performance, increased functionality and economy of manufacture.

In recent years, there has been significant research and development with regard to nonplanar transistor architectures. Some non-planar transistor architectures, such as VFETs, employ semiconductor fins and side-gates that can be contacted outside the active region, resulting in increased device density and some increased performance over lateral devices. In VFETs the source to drain current flows in a direction that is perpendicular to a major surface of the substrate. For example, in a known VFET configuration a major substrate surface is horizontal and a vertical fin or nanowire extends upward from the substrate surface. The fin or nanowire forms the channel region of the transistor. A source region and a drain region are situated in electrical contact with the top and bottom ends of the channel region, while the gate is disposed on one or more of the fin or nanowire sidewalls.

Electrostatic discharge devices and circuits are indispensable elements in integrated chip (IC) manufacturing. Electrostatic discharge is the sudden flow of electricity between electrically charged objects which can cause damage to the IC or other sensitive electronic devices when the current flow exceeds the allowable amount of electricity manageable by the device. If the electrostatic discharge device is not triggered at an acceptable range or if the electrostatic discharge is not sufficient enough to remove the discharged current further damage and failure to the electronic device can occur.

SUMMARY

Embodiments of the present invention are directed to a computer-implemented method for using vertical fin CMOS technology for electrostatic discharge protection. A non-limiting example of the computer-implemented method includes forming a first set of semiconductor fins vertically extending from a substrate, forming a second set of semiconductor fins vertically extending from the substrate, forming a first layer on the substrate, forming a second layer atop a portion of the first layer, wherein a junction is formed between the first layer and the second layer, wherein a length of the junction is defined by the first set of semiconductor fins and the second set of semiconductor fins, forming a first metal contact atop the first layer, and forming a second metal contact atop the second layer.

Embodiments of the present invention are directed to a computer-implemented method for using vertical fin CMOS technology for electrostatic discharge protection. A non-limiting example of the computer-implemented method includes forming a first set of semiconductor fins vertically extending from a substrate, forming a second set of semiconductor fins vertically extending from the substrate, forming a first layer on the substrate, wherein the first layer is formed by ion implantation, forming a silicide layer atop the first layer, forming a first metal contact atop the first layer, and forming a second metal contact atop the silicide layer.

Embodiments of the present invention are directed to a device for using vertical fin CMOS technology for electrostatic discharge protection. A non-limiting example of the device includes a first set of semiconductor fins vertically extending from a substrate, a second set of semiconductor fins vertically extending from the substrate, a PN junction formed by a first epitaxy layer and a second epitaxy layer, wherein a length of the PN junction is defined by the first set of semiconductor fins and the second set of semiconductor fins, a first metal contact coupled to a first layer, and a second metal contact atop a second layer.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 1 depicts a cross-sectional view of a semiconductor structure after a processing operation according to one or more embodiments of the invention;

FIG. 2 depicts a cross-sectional view of a semiconductor structure after a processing operation according to one or more embodiments of the invention;

FIG. 3 depicts a cross-sectional view of a semiconductor structure after a processing operation according to one or more embodiments of the invention;

FIG. 4 depicts a cross-sectional view of a semiconductor structure after a processing operation according to one or more embodiments of the invention;

FIG. 5 depicts a cross-sectional view of a semiconductor structure after a processing operation according to one or more embodiments of the invention;

FIG. 6 depicts a cross-sectional view of a semiconductor structure after a processing operation according to one or more embodiments of the invention;

FIG. 7 depicts a cross-sectional view of a semiconductor structure after a processing operation according to one or more embodiments of the invention;

FIG. 8 depicts a cross-sectional view of a semiconductor structure after a processing operation according to one or more embodiments of the invention;

FIG. 9 depicts a cross-sectional view of a semiconductor structure after a processing operation according to one or more embodiments of the invention;

FIG. 10 depicts a cross-sectional view of a semiconductor structure after a processing operation according to one or more embodiments of the invention;

FIG. 11 depicts a cross-sectional view of a semiconductor structure after a processing operation according to one or more embodiments of the invention;

FIG. 12 depicts a cross-sectional view of a semiconductor structure after a processing operation according to one or more embodiments of the invention;

FIG. 13 depicts a cross-sectional view of a semiconductor structure after a processing operation according to one or more embodiments of the invention;

FIG. 14 depicts a cross-sectional view of a semiconductor structure after a processing operation according to one or more embodiments of the invention;

FIG. 15 depicts a cross-sectional view of a semiconductor structure after a processing operation according to one or more embodiments of the invention;

FIG. 16 depicts a cross-sectional view of a semiconductor structure after a processing operation according to one or more embodiments of the invention;

FIG. 17 depicts a cross-sectional view of a semiconductor structure after a processing operation according to one or more embodiments of the invention;

FIG. 18 depicts a cross-sectional view of a semiconductor structure after a processing operation according to one or more embodiments of the invention;

FIG. 19 depicts a cross-sectional view of a semiconductor structure after a processing operation according to one or more embodiments of the invention;

FIG. 20 depicts a cross-sectional view of a semiconductor structure after a processing operation according to one or more embodiments of the invention;

FIG. 21 depicts a cross-sectional view of a semiconductor structure after a processing operation according to one or more embodiments of the invention;

FIG. 22 depicts a cross-sectional view of a semiconductor structure after a processing operation according to one or more embodiments of the invention;

FIG. 23 depicts a cross-sectional view of a semiconductor structure after a processing operation according to one or more embodiments of the invention;

FIG. 24 depicts a cross-sectional view of a semiconductor structure after a processing operation according to one or more embodiments of the invention;

FIG. 25 depicts a cross-sectional view of a semiconductor structure after a processing operation according to one or more embodiments of the invention;

FIG. 26 depicts a cross-sectional view of a semiconductor structure after a processing operation according to one or more embodiments of the invention;

FIG. 27 depicts a cross-sectional view of a semiconductor structure after a processing operation according to one or more embodiments of the invention

FIG. 28 depicts a cross-sectional view of a semiconductor structure after a processing operation according to one or more embodiments of the invention;

FIG. 29 depicts a cross-sectional view of a semiconductor structure after a processing operation according to one or more embodiments of the invention;

FIG. 30 depicts a cross-sectional view of a semiconductor structure after a processing operation according to one or more embodiments of the invention;

FIG. 31 depicts a cross-sectional view of a semiconductor structure after a processing operation according to one or more embodiments of the invention;

FIG. 32 depicts a cross-sectional view of a semiconductor structure after a processing operation according to one or more embodiments of the invention;

FIG. 33 depicts a cross-sectional view of a semiconductor structure after a processing operation according to one or more embodiments of the invention;

FIG. 34 depicts a cross-sectional view of a semiconductor structure after a processing operation according to one or more embodiments of the invention;

FIG. 35 depicts a cross-sectional view of a semiconductor structure after a processing operation according to one or more embodiments of the invention;

FIG. 36 depicts a cross-sectional view of a semiconductor structure after a processing operation according to one or more embodiments of the invention;

FIG. 37 depicts a cross-sectional view of a semiconductor structure after a processing operation according to one or more embodiments of the invention;

FIG. 38 depicts a cross-sectional view of a semiconductor structure after a processing operation according to one or more embodiments of the invention;

Figure 1:
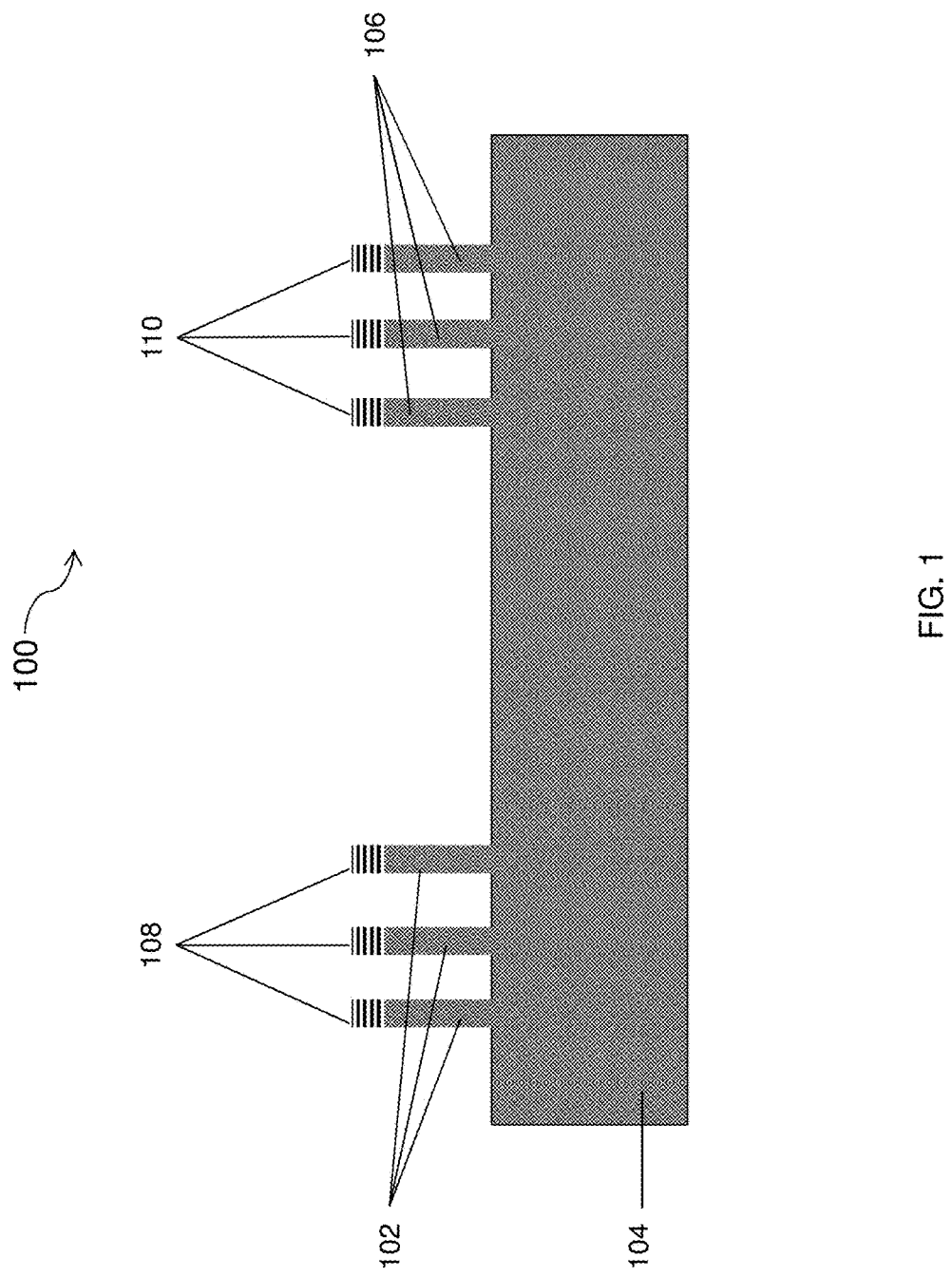
FIGS. 1-14 depict a cross-sectional view of a first embodiment of a semiconductor structure after various processing operations according to one or more embodiments of the inventions.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Turning now to an overview of technologies that are more specifically relevant to aspects of the invention, ESD devices are designed according to a set of parameters to achieve performance characteristics that are suitable for various applications. The normal operating voltage, breakdown voltage, and thermal failure temperature of the ESD are all considered in its design. These parameters create an ESD design window.

For any ESD design, the I-V characteristics must be the criteria defined in the window. For example, if the voltage detected by the ESD device is below the operating voltage, the ESD device remains off as no protection is required. If the ESD device is not turned fast enough before reaching a threshold voltage indicating an ESD event, then the true device that is coupled to the ESD device will be damaged. Thermal failure can occur in the event the voltage continues to increase. It is critical to consider these parameters when designing an ESD device.

Traditional ESD protection diodes are implanted source/drain to N/P type well to form PN junction diodes. These diodes generally have high reverse breakdown voltages due to moderate well doping. In addition, these ESD devices are large when compared to the electronics that are protected by the ESD devices because the ESD devices are configured remove large amounts of current in a very short period of time. The challenge arises as the electronic devices get smaller and approach nanometer technology range, the ESD devices will need to provide protection over a lower range of voltages. The breakdown voltages for ESD devices have been configured as low as 2.5 V. Conventional diodes used for ESDs are not triggered until they reach 5-10 volts which is typical for 90 nm technology and beyond. This configuration can cause damage to the CMOS technology true device which is now operating at voltages as low as 2.5 V. However, in today's vertical field-effect transistor (VFET) technology, the normal operating voltages are approximately 0.75 V, where the traditional diodes will not be triggered until 2.5 V.

In advanced vertical FIN technologies, high-k and WFM form the gates and the gate dielectric breakdown is relatively low (approximately 2-3 V) where a narrow ESD design window exists. To achieve the low gate breakdown voltage ESD protection, a relatively low Zener BV diode is required. For an effective ESD protection device, a fast turn-on device is necessary to by-pass the surge current from the true device, Schottky diodes can be applied to those applications. TVS diodes can also be used for circuit voltage spike protection and voltage clamping.

In addition, the conventional diodes use ion implantation to form the ESD devices which can lead to channeling effects that impact the properties of the junctions that have been developed. Using an epitaxial growth technique, an even distribution and predictable junction can be formed in a controlled manner.

Turning now to an overview of the aspects of the invention, one or more embodiments of the invention address the above-described shortcomings of the prior art by providing PN junctions of the diodes that are vertically stacked and bounded by FINs on each edge of the PN junctions for ohmic contacts. In one or more embodiments, the diode is formed by epitaxy, where both the N and P layers can be highly doped for Zener applications. In another embodiment, the Schottky diodes are FIN bounded, where the guard ring region is in the FIN body for ohmic contact. In this example, the semiconductor device includes a regularly doped well. The only mask required in this particular embodiment is used for FIN doping by ion implantation.

In one or more embodiments, an i-layer can be epitaxially grown to for a PiN diode. PiN diodes can be used in the application of ESD protection and radio frequency (RF) switch circuits.

One or more techniques described herein includes building an ESD protection device. Generally diodes are used for ESD. Various type of diodes can be used for ESD protection. These diodes include Zenner diodes, Schottky diodes, and transient voltage suppression (TVS) diodes are used to provide ESD protection. It is to be understood that other types of diodes can be used for ESD protection.

The N and P regions are stacked and epitaxially grown to form abrupt junctions. Implanting causes channeling where the surfaces can be overlapped, non-homogeneous. If the implant angle is straight, channeling will occur and the forming of the PN junction is difficult to control. In addition, the FINs are used as boundaries to create a very accurate distance for the PN junction to determine its properties.

Turning now to a more detailed description of aspects of the present invention, FIG. 1 depicts a cross-sectional view of the structure 100 and a method of fabricating a semiconductor device according to one or more embodiments of the invention. FIGS. 1-12 depict a cross-sectional view of the structure 100. The PN junction diodes are vertically stacked with FIN bounded edges to separate N+ and P+ ohmic contacts. This configuration provides for no parasitic conducting paths in the structure for any shunt leakage vertically and laterally. The diode is made by epitaxial deposition, where both the N and P regions can be doped as high as to $10^{20}$ for Zener application.

As depicted in FIG. 1, a partially fabricated semiconductor device 100 can include one or more vertical FINs 102 and 106 formed on a silicon substrate 104. As shown in FIG. 1, a hard mask 108 is formed over a first set of vertical FINs 102 and a hard mask 110 is formed over a second set of vertical FINs 106.

Each of the FINs 102 and 106 can have a height ranging from 1 nm to 150 nm, for example, from 10 nm to 50 nm. Each of the FINs 102 and 106 can have a width ranging from 5 nm to 40 nm, for example, from 10 nm to 20 nm. Adjacent FINs can be separated by a pitch ranging from 20 nm to 100 nm, for example, from 30 nm to 50 nm.

The substrate can be any suitable substrate material, such as, for example, monocrystalline Si, SiGe, SiC, III-V compound semiconductor, II-VI compound semiconductor, or semiconductor-on-insulator (SOI). In some embodiments of the invention, the substrate includes a buried oxide layer (not depicted). The FINs 102 and 106 can be electrically isolated from other regions of the substrate by a shallow trench isolation (STI). The STI (not depicted) can be of any suitable dielectric material, such as, for example, a silicon oxide.

In some embodiments of the present invention, the FINs 102 and 106 are patterned using a hard mask. The hard mask includes any suitable hard mask material, such as, for example, a silicon nitride. The hard mask can be formed utilizing a deposition process such as, for example, CVD, plasma enhanced chemical vapor deposition (PECVD), chemical solution deposition, or evaporation. In some embodiments of the invention, the hard mask is formed by a thermal process such as, for example, oxidation or nitridation. The hard mask can have a thickness of about 5 nm to 150 nm, for example, from 30 nm to 60 nm.

Figure 2:
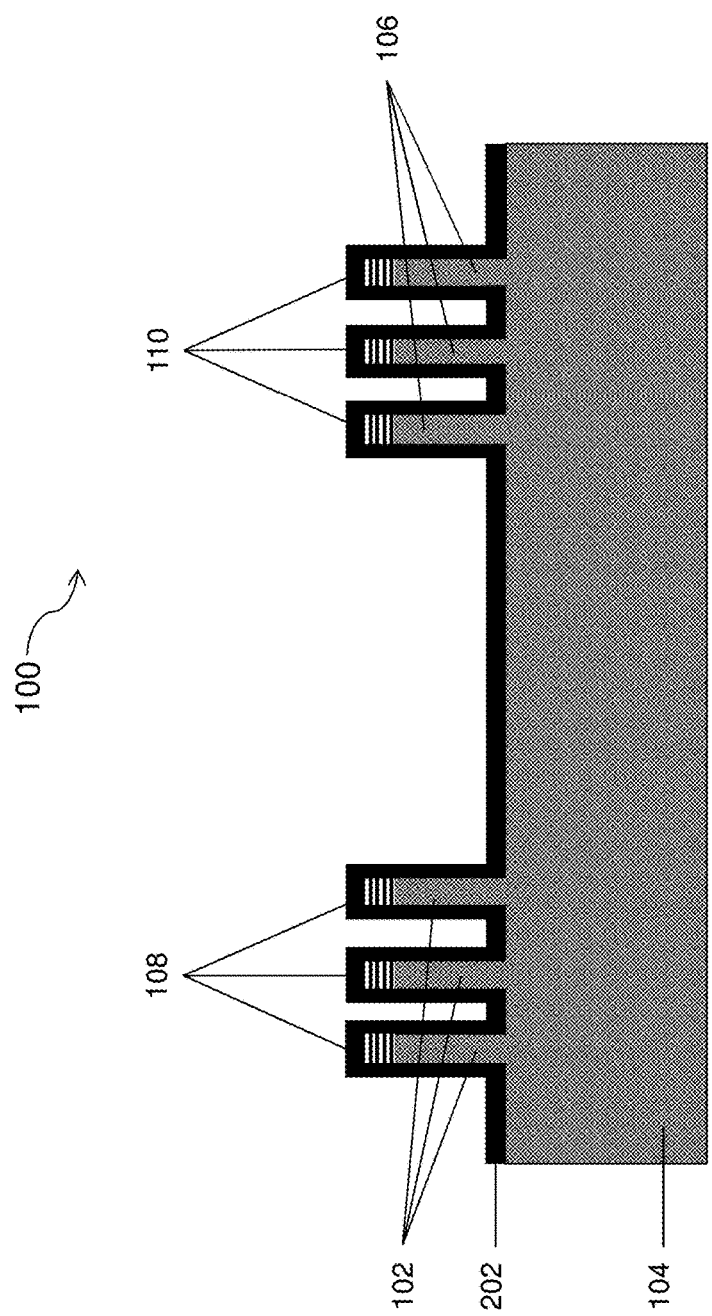

FIG. 2 depicts a cross-sectional view of the structure 100 after forming a bottom spacer 202 over the FINs 102 and 106 and substrate 104. In one or more embodiments, the bottom spacer 202 is a conforming spacer liner which adheres to the surface of the substrate 104.

The bottom spacer 202 can be formed over a high-k gate dielectric film, the WFMs, and the metal oxide layer, as well as on sidewalls of the FINs 102 and 106. The bottom spacer 202 can include a dielectric material, such as silicon oxide, silicon nitride, silicon oxynitride, or a combination thereof, and can be formed using known deposition processes.

Figure 3:
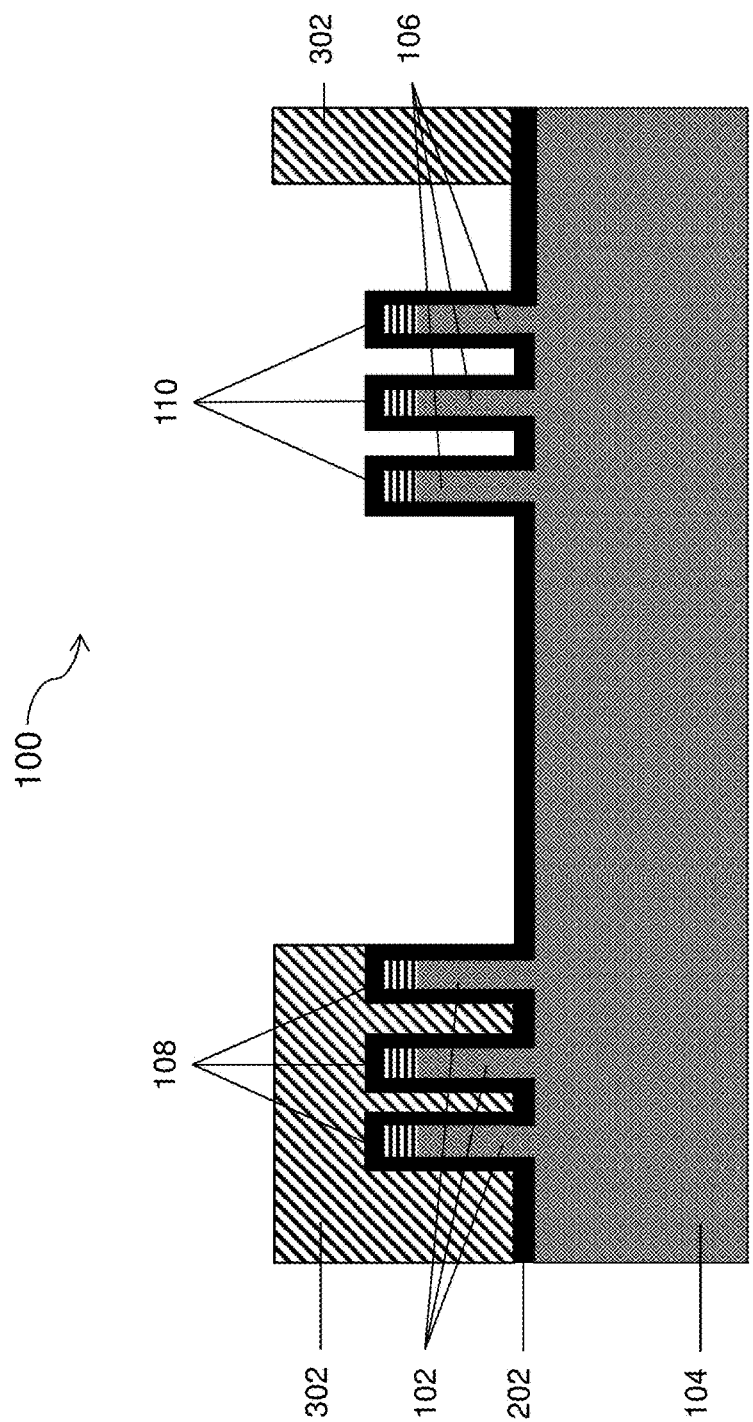

FIG. 3 depicts a cross-sectional view of the structure 100 after patterning a block mask 302 over selected regions of the structure 100. In one or more embodiments, the block mask 302 is selectively patterned on the bottom spacer 202. In one or more embodiments, the block mask 302 can be selectively patterned over one or more sets of FINs 102 and 106. In other embodiments, the block mask 302 can be selectively patterned over the other portions of the structure 100 for patterning an N+ opening and providing a mask 302 for patterning other logic devices.

Figure 4:
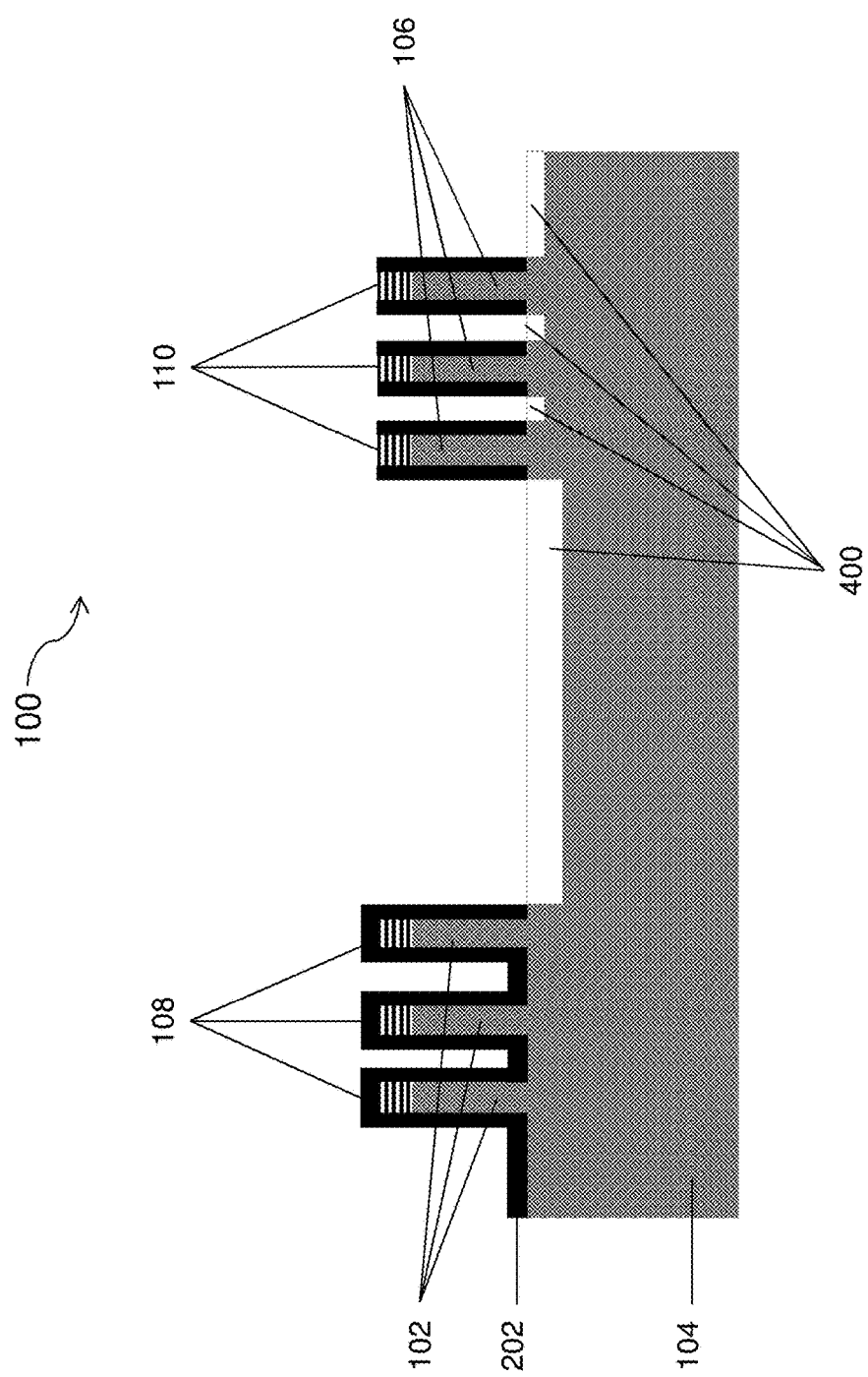

FIG. 4 depicts a cross-sectional view of the structure 100 after selectively removing the bottom spacer 202 and recessing one or more portions of the structure 100 for epitaxially growing an epi-layer. In one or more embodiments, one or more portions of the bottom spacer 202 are removed from the substrate 104 to expose one or more regions for growing the epi-layer. In one or more embodiments, portions of the bottom spacer 202 are removed from a top portion of a set of FINs 106 to expose a portion of the FINs 106 as shown in FIG. 4. In one or more embodiments, a channel 400 is exposed as the block mask 302 and bottom spacer 202 are removed. In some embodiments, the removal and recess are performed for the 30~60 nm for epitaxial growth.

Figure 5:
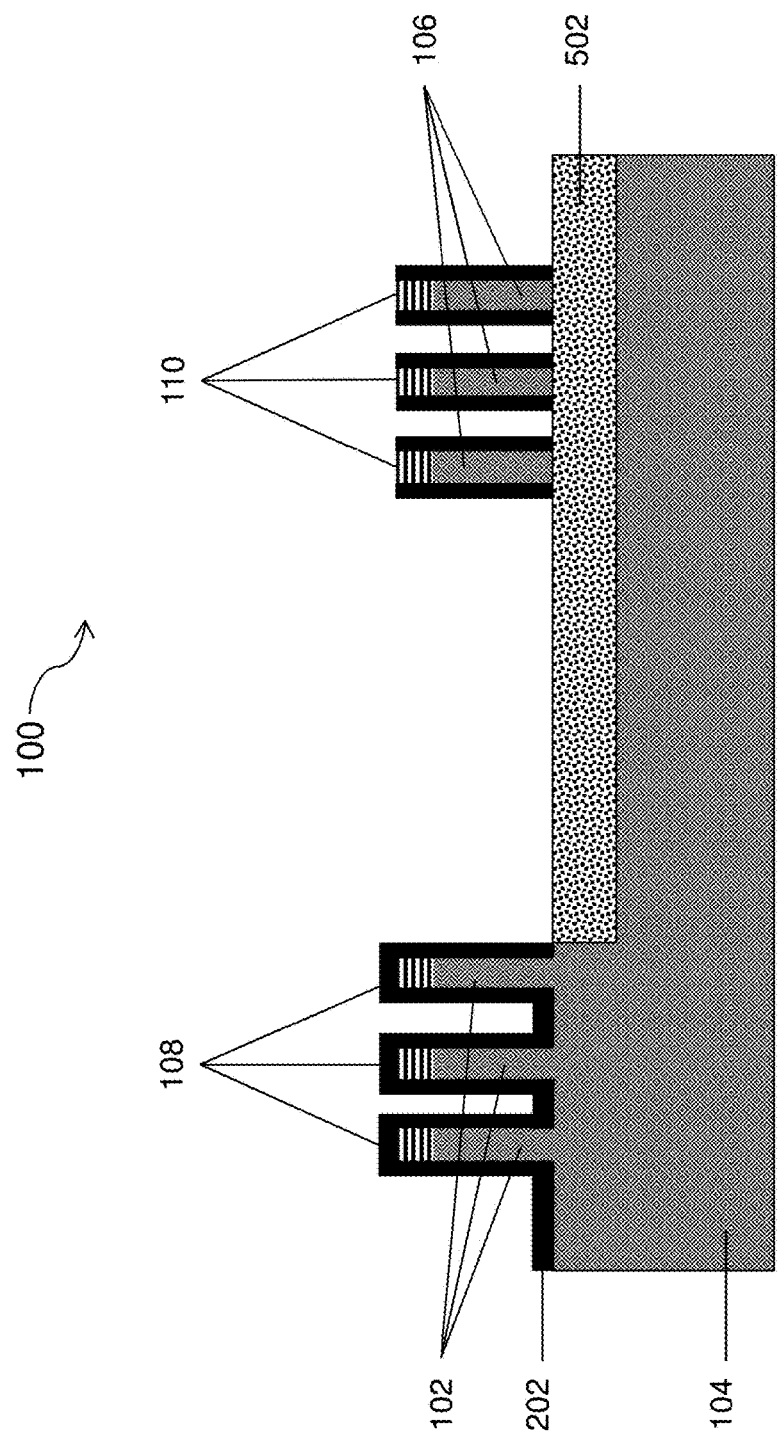

FIG. 5 depicts a cross-sectional view of the structure 100 after epitaxially growing a layer 502 (a first layer) and annealing the layer 502 in the exposed regions of the structure 100. In one or more embodiments, the epi-layer 502 is an N+ doped region.

In some embodiments of the invention, epitaxial regions are epitaxially grown over the substrate. Epitaxial semiconductor materials can be grown using vapor-phase epitaxy (VPE), MBE, liquid-phase epitaxy (LPE), or other suitable processes. Epitaxial silicon, SiGe, and/or carbon doped silicon (Si:C) can be doped during deposition (in-situ doped) by adding dopants, n-type dopants (e.g., phosphorus or arsenic) or p-type dopants (e.g., Ga, B, $BF_2$, or Al). The dopant concentration in the doped regions can range from $1 \times 10^{18}$ $cm^{-3}$ to $2 \times 10^{21}$ $cm^{-3}$, or between $1 \times 10^{19}$ $cm^{-3}$ and $1 \times 10^{21}$ $cm^{-3}$. The first layer doping concentration is set to 1 or 2 orders of magnitude lower than the second layer so that the depletion layer mostly exists in the first layer when the diode is reverse biased.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments of the invention, epitaxial growth and/or deposition processes are selective to forming on semiconductor surface, and generally do not deposit material on exposed surfaces, such as silicon dioxide or silicon nitride surfaces.

Figure 6:
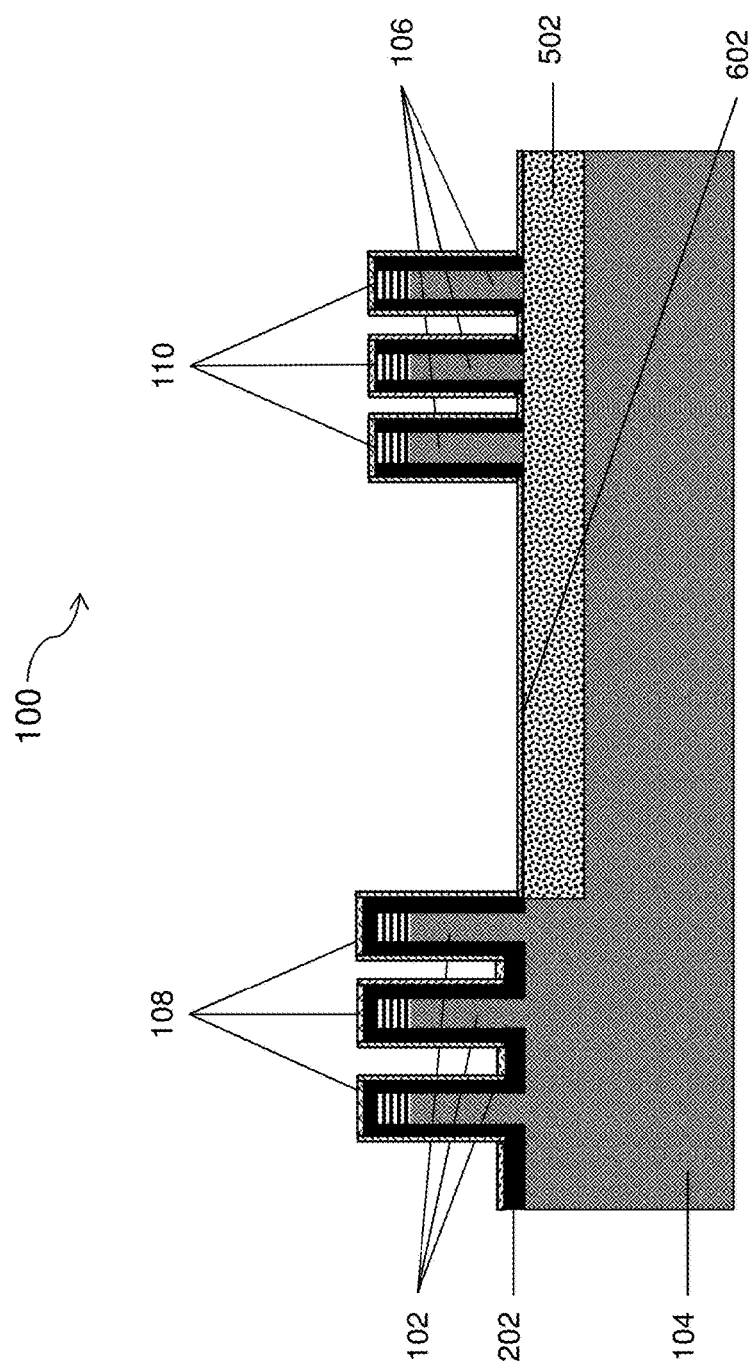

In some embodiments of the invention, the gas source for the deposition of epitaxial semiconductor material includes a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used. In some embodiments of the invention, the doped regions include silicon. In some embodiments of the invention, the doped regions include carbon doped silicon (Si:C). This Si:C layer can be grown in the same chamber used for other epitaxy steps or in a dedicated Si:C epitaxy chamber. The Si:C can include carbon in the range of about 0.2 percent to about 3.0 percent FIG. 6 depicts a cross-sectional view of the structure 100 depositing a dielectric film 602 on the structure 100. In one or more embodiments, the dielectric film 602 is a conformally deposited SiN dielectric film 602. The conforming dielectric film 602 can be grown over the first set of FINs 102, second set of FINs 106, and in the channel between the first set of FINs 102 and the second set of FINs 106. In some embodiments, the dielectric film 602 is formed by atomic layer deposition (ALD), and in some embodiments, the dielectric film 602 is formed by chemical vapor deposition (CVD).

Figure 7:
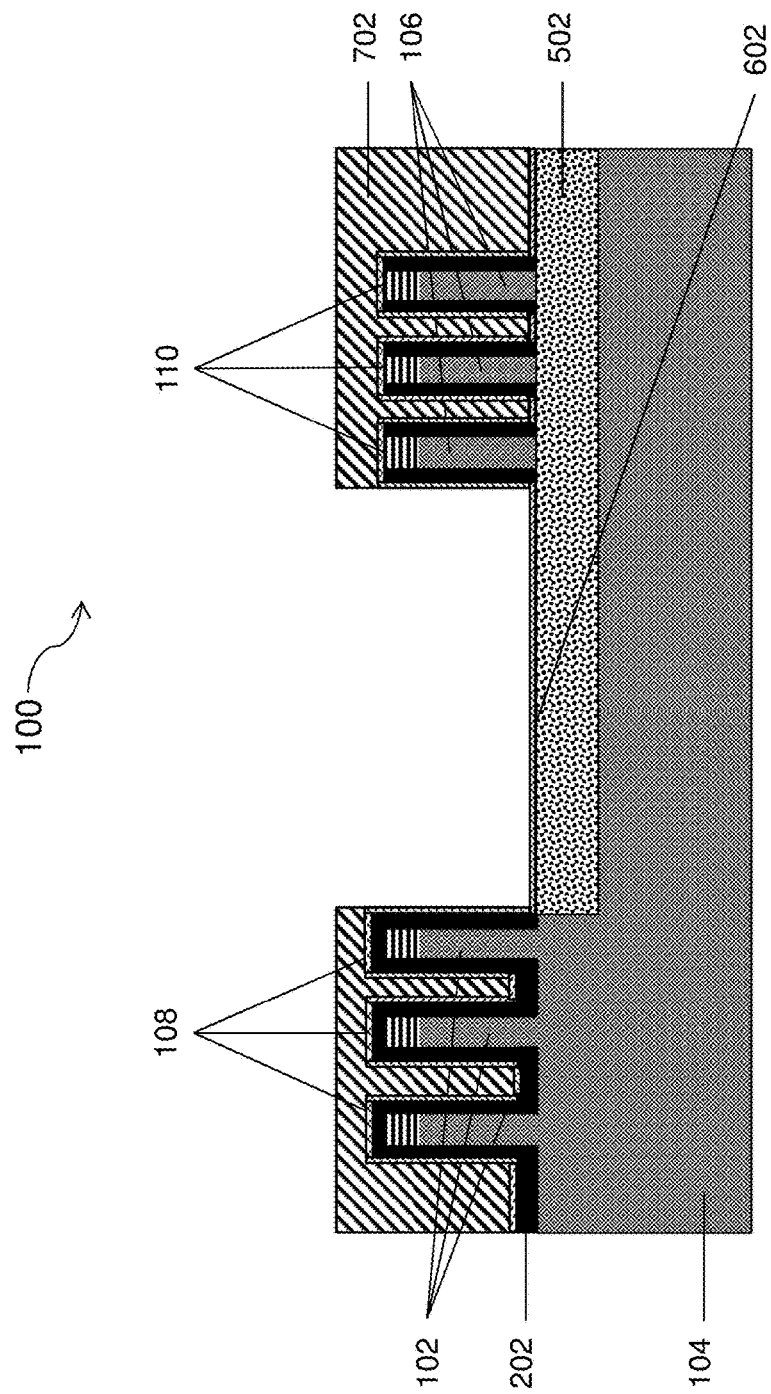

FIG. 7 depicts a cross-sectional view of the structure 100 after selectively adding a block mask 702 over one or more portions of the dielectric film 602.

Figure 8:
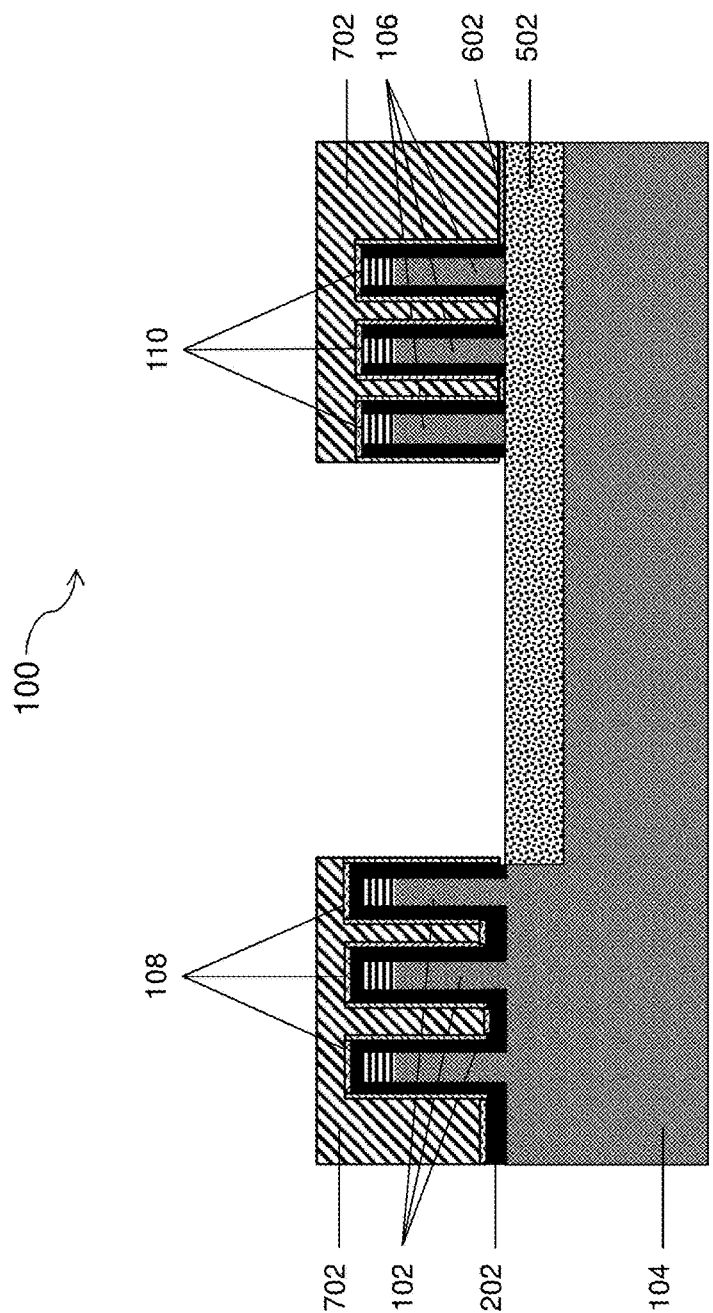

FIG. 8 depicts a cross-sectional view of the structure 100 after removing one or more portions of the dielectric film 602 to expose one or more regions of the structure 100. In one or more embodiments, the dielectric film 602 is removed from the channel region between the first set of FINs 102 and the second set of FINs 106 as shown in FIG. 8.

Figure 9:
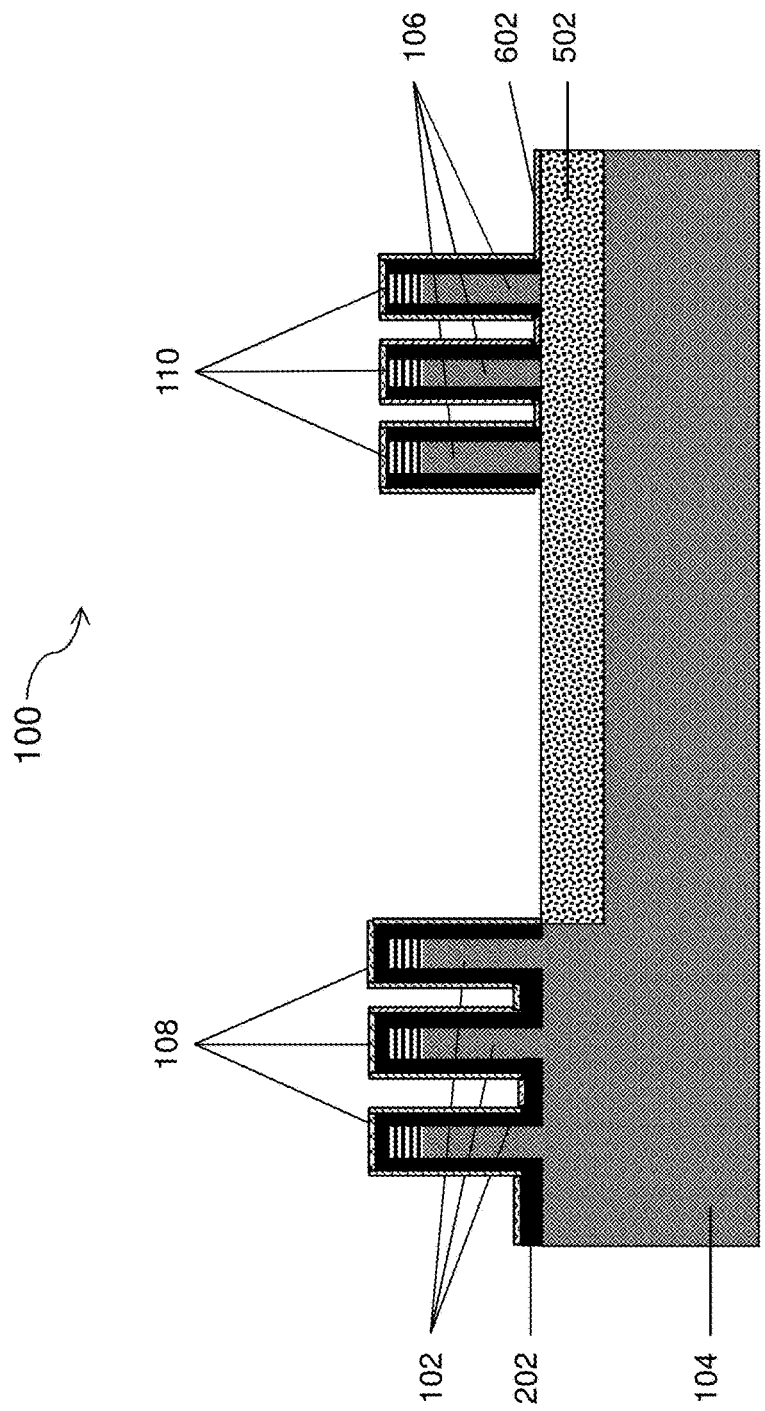

FIG. 9 depicts a cross-sectional view of the structure 100 after removing the patterned block mask 702. In one or more embodiments, the dielectric film 602 over the first set of FINs 102 and the second set of FINs 106 is exposed as shown in FIG. 8.

Figure 10:
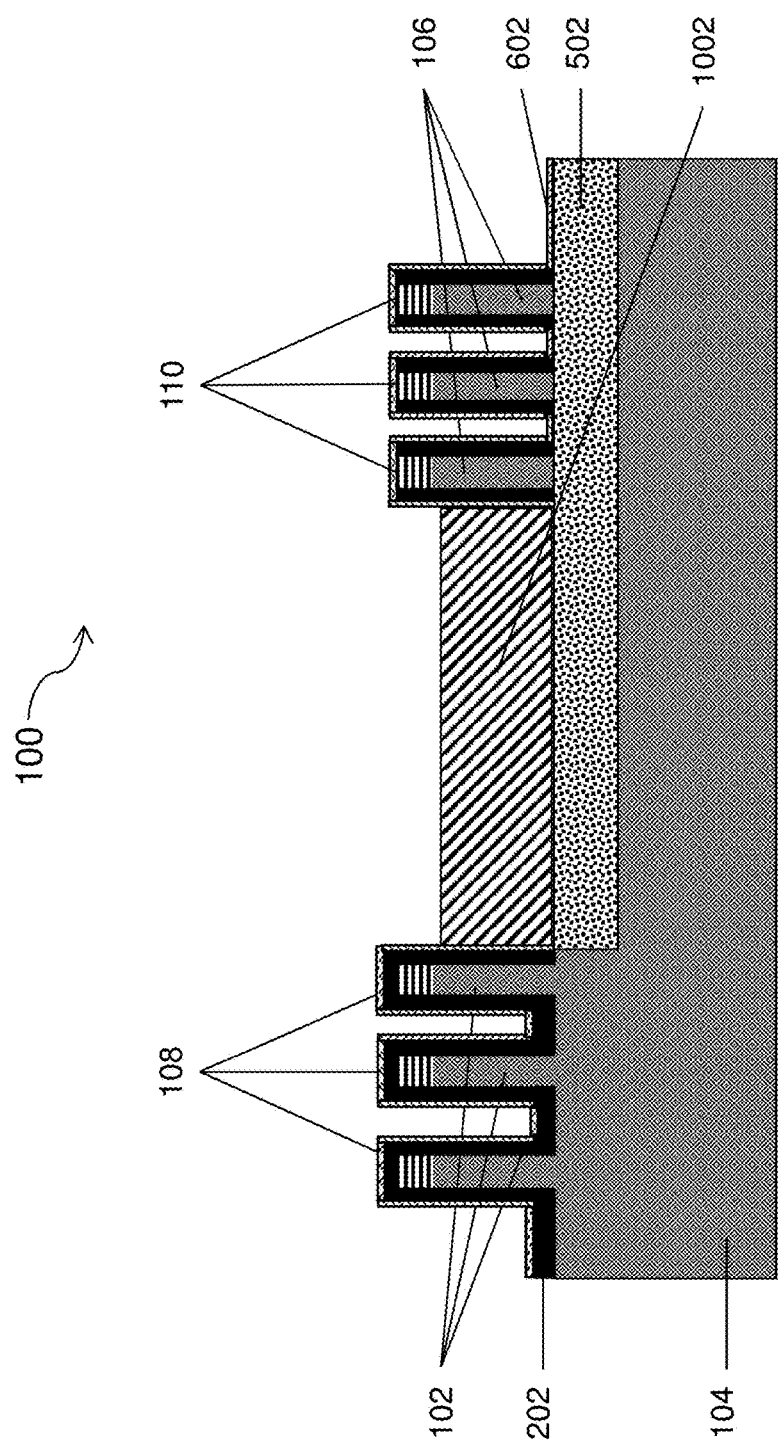

FIG. 10 depicts a cross-sectional view of the structure 100 after epitaxially growing an epi-layer 1002 (a second layer) in the exposed regions of the substrate 104. In one or more embodiments, the epi-layer 1002 is a P+ layer. The layer 1002 and the layer 502 form the PN junction between the layer 1002 and the layer 502

Figure 11:
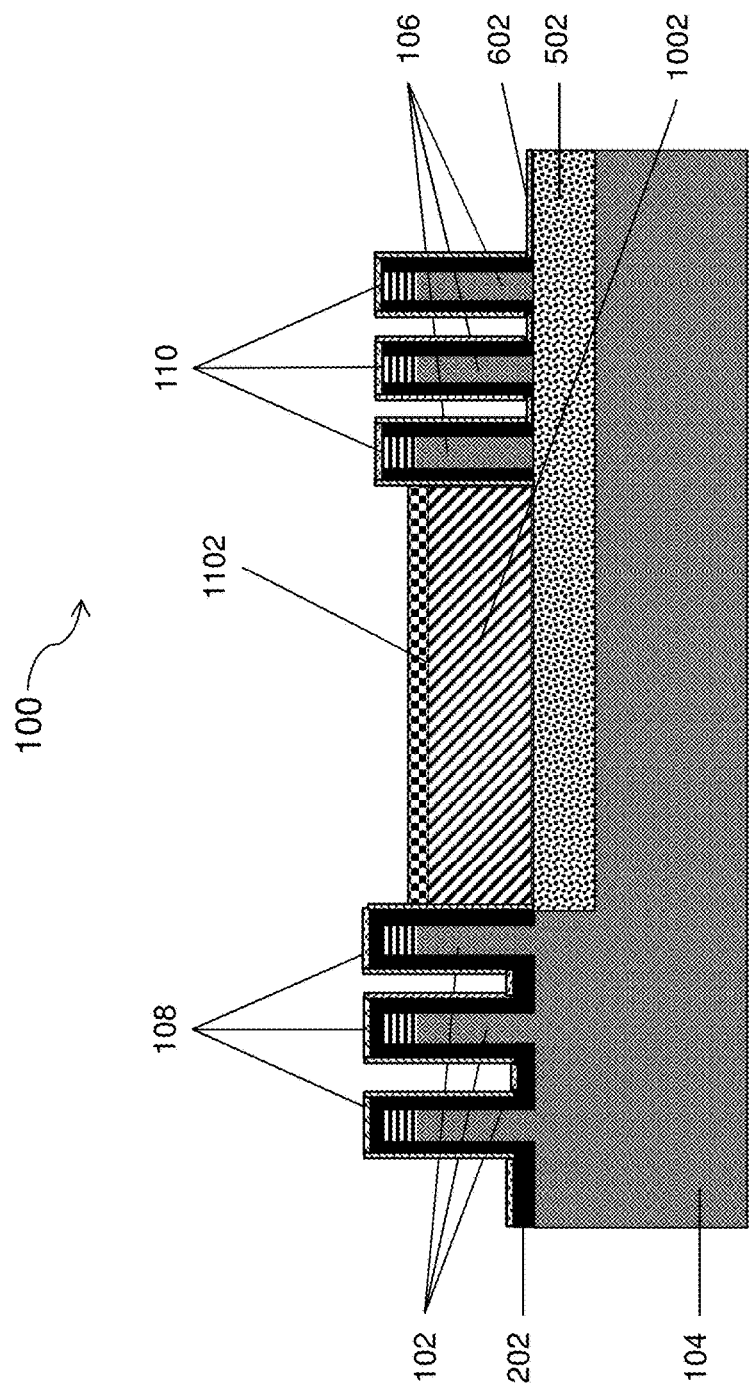

FIG. 11 depicts a cross-sectional view of the structure 100 after forming a silicidation layer 1102. In one or more embodiments, the silicidation layer 1102 is formed over the epi-layer 1002 between the first set of FINs 102 and the second set of FINs 106. In one or more embodiments, the silicidation layer 1102 can be composed of NiSi, PiPtSi, TiSi, Wsi, etc.

In one or more embodiments, an ILD is formed between the layer 502 and the layer 1002 described below. An interlayer dielectric (ILD) is formed over the structure 100. The ILD can be any suitable dielectric material, such as, for example, a silicon oxide, and can be formed using any suitable process. In some embodiments of the invention, the ILD is planarized to a surface of the WFMs and/or the metal oxide layer using, for example, CMP. In some embodiments of the invention, the CMP can be utilized to remove excess portions of the ILD selective to the WFMs, the metal oxide layer, and/or the FINs 102 and 106. In some embodiments, the interlayer is optional in between N+ and P+ layer to make P-i-N diodes, which provide a knob of P+ to N+ spacing for breakdown adjustment. The diode area can be larger too in um² size for large ESD current purging.

Figure 12:
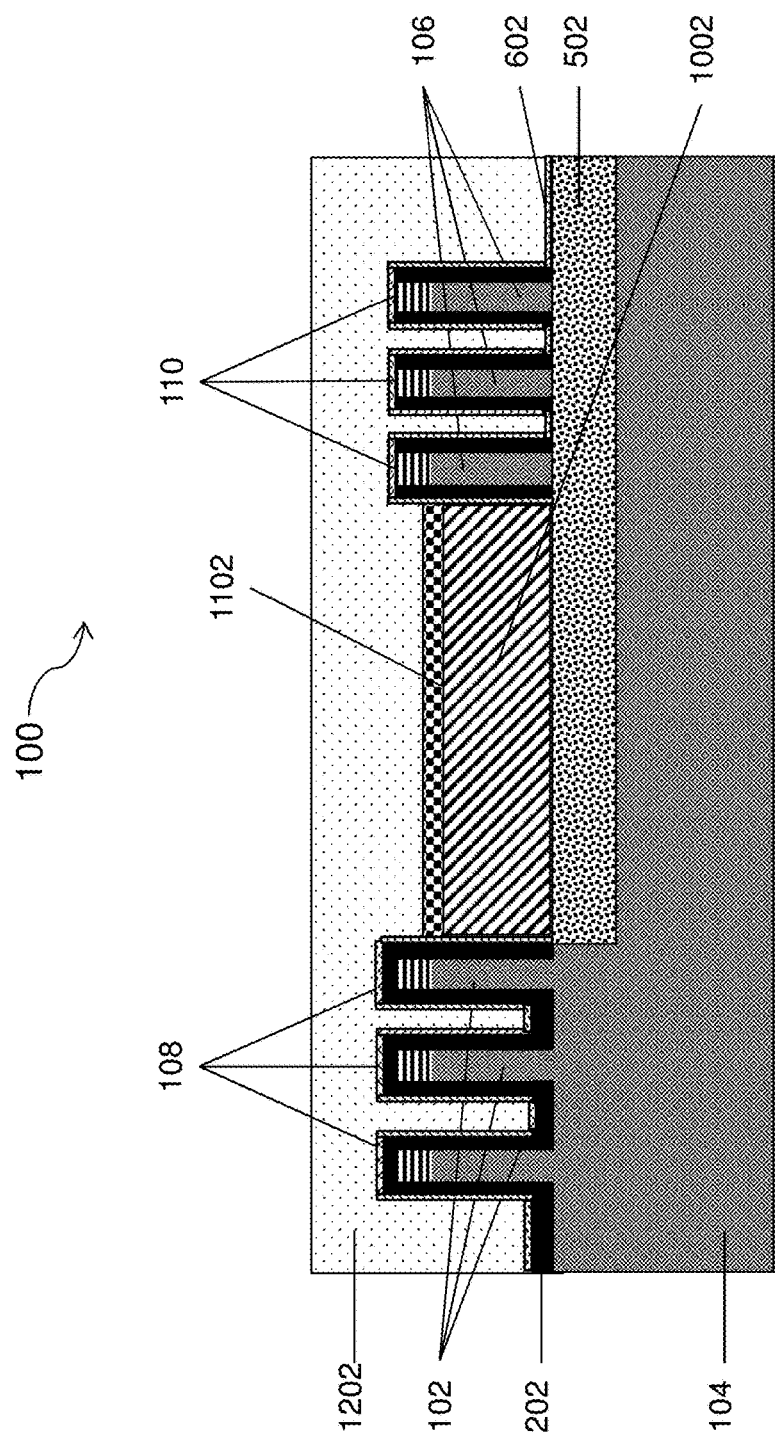
Figure 13:
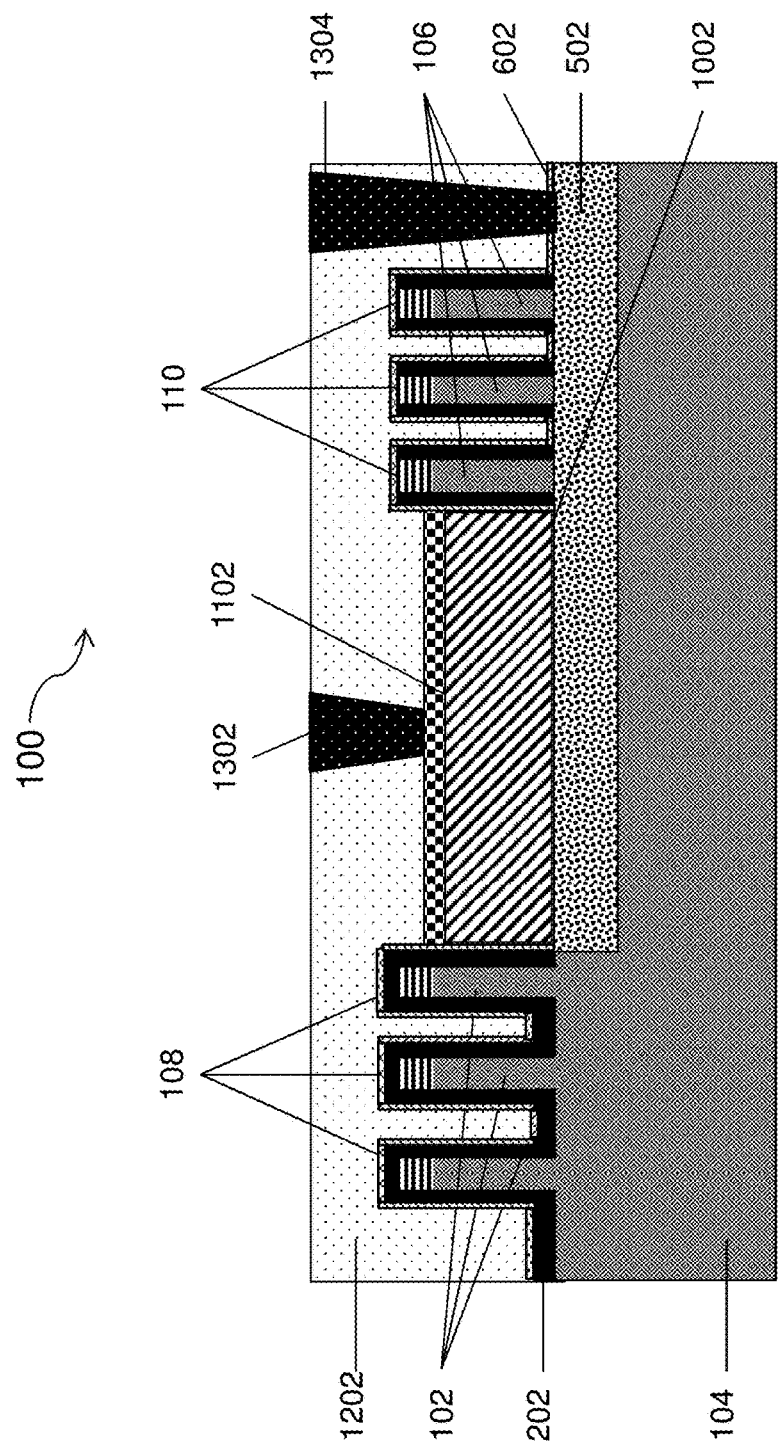

FIG. 12 depicts a cross-sectional view of the structure 100 after filling in the structure 100 with a dielectric 1202. FIG. 13 depicts a cross-sectional view of the structure 100 after creating one or more trenches in the dielectric layer 1002 and forming metal contacts 1302 and 1304. In one or more embodiments, FIG. 13 depicts a cross-sectional view of the structure 100 after forming a metal liner, NFET top S/D contact, and PFET top S/D contact during an intermediate operation of the exemplary method of fabricating a semiconductor device according to one or more embodiments of the invention. The top contacts can be formed using known metallization techniques. In some embodiments of the invention the thickness of the ILD is increased by depositing additional dielectric material prior to forming the top contacts. The ILD can then be patterned into open trenches (not depicted) using known processes, such as a wet or dry etch. In some embodiments of the invention, the top contacts are overfilled into the trenches, forming overburdens above a surface of the ILD. The overburden can then be planarized using, for example, CMP.

The metal contacts can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. In some embodiments of the invention, the top contacts include tungsten and the metal liner is a Ti/TiN liner. The metal liner is a barrier that prevents metal in the top contacts from diffusing into, or doping, the surrounding materials, which can degrade their properties. Silicon, for example, forms deep-level traps when doped with copper. An ideal barrier metal liner must limit metal diffusivity sufficiently to chemically isolate the conductor from the surrounding materials and should have a high electrical conductivity, for example, tantalum nitride and tantalum (TaN/Ta), titanium, titanium nitride, cobalt, ruthenium, and manganese.

Figure 14:
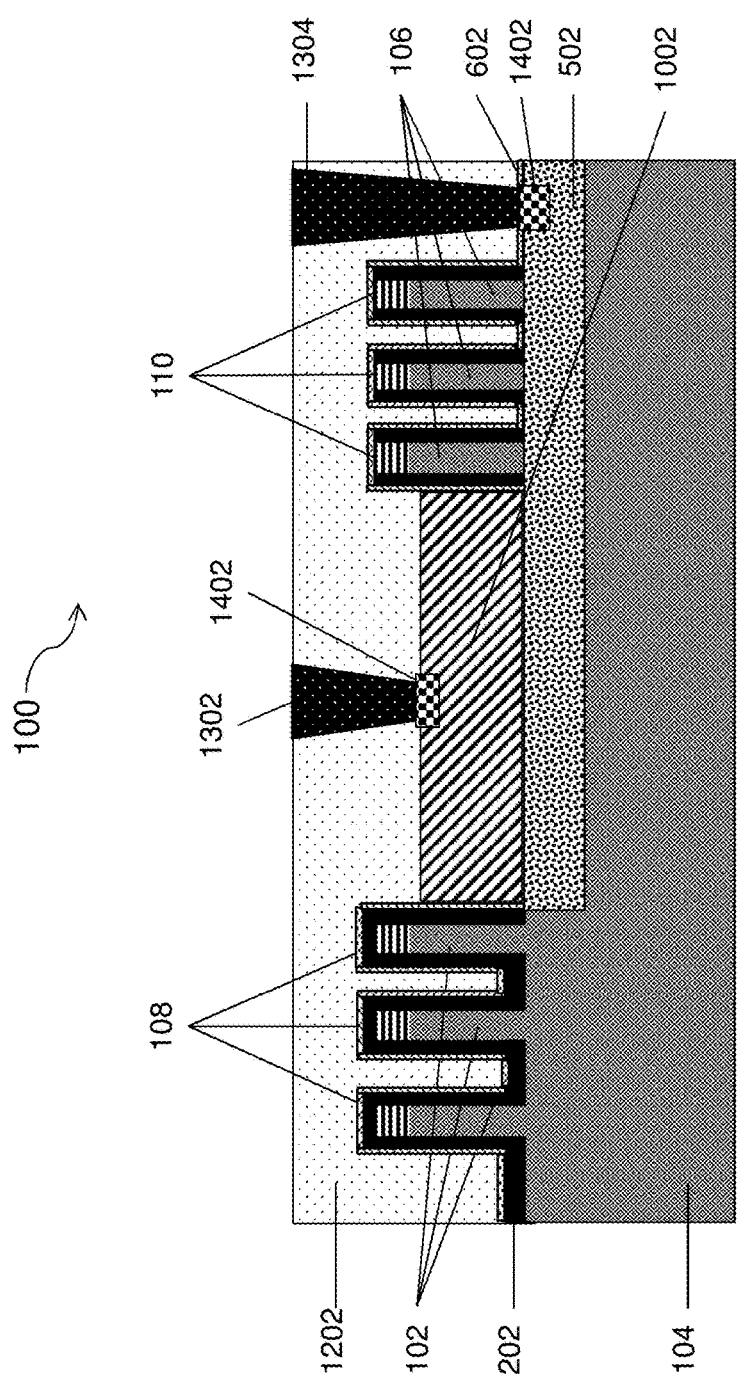

FIG. 14 depicts a cross-sectional view of a different embodiment of the structure 100 after selectively forming a silicide layer 1402 between one or more metal contacts 1302 and 1304 and the substrate 104.

Figure 15:
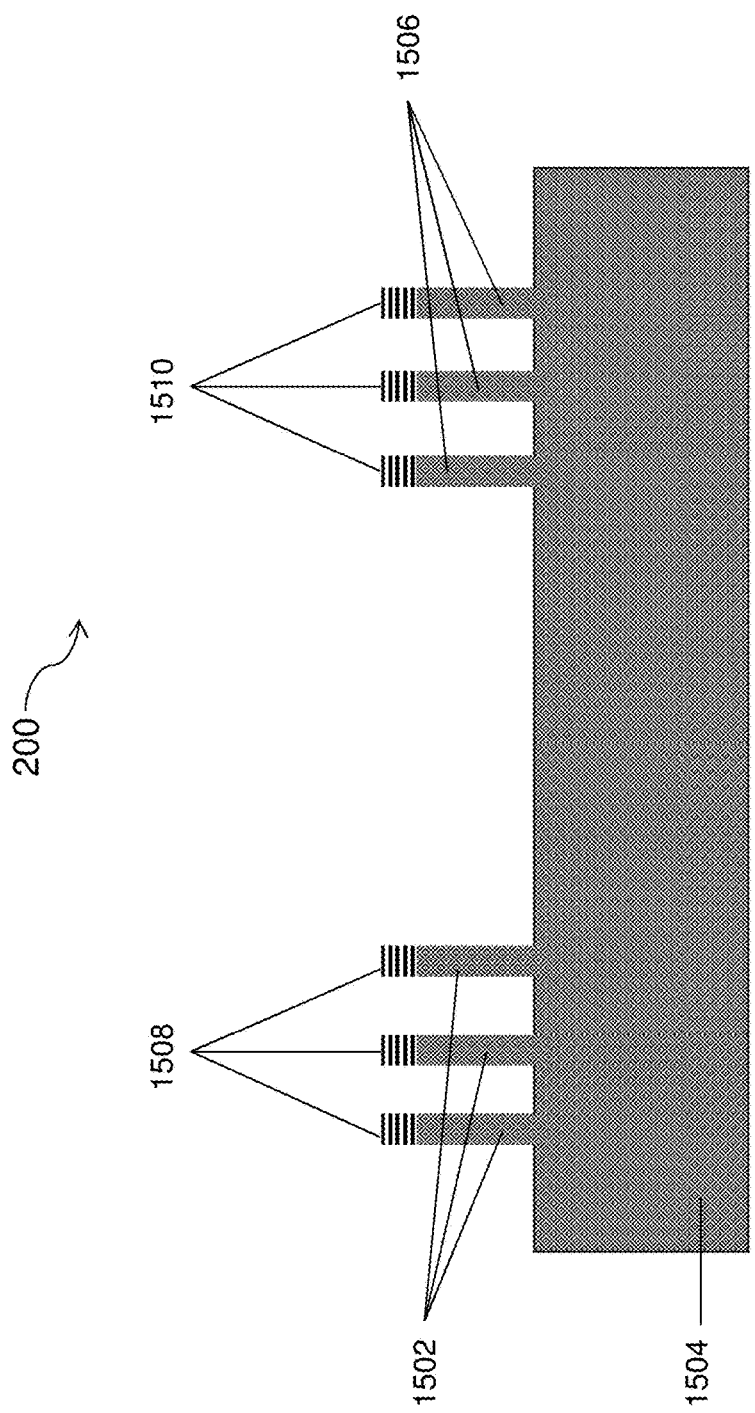
FIGS. 15-27 depict a cross-sectional view of a first embodiment of a semiconductor structure after various processing operations according to one or more embodiments of the inventions.

FIGS. 15-27 depict a cross-sectional view of a semiconductor device in accordance with one or more embodiments. The PN junction diodes are vertically stacked with FIN bounded edges to separate N+ and P+ ohmic contacts. The configuration provides that no parasitic conducting path in such structure for any shunt leakage vertically and laterally. The diode with top layer is made by epitaxial deposition, but the bottom is made by ion implantation. The ion implantation layer after thermal activation needs to be maintained the surface doping concentration high to above $10^{19}$ to maintain the Zener diode application requirement. As depicted in FIG. 15, a structure 200 is initially formed in a similar manner as the structure 100 depicted in FIG. 1.

As depicted in FIG. 15, a partially fabricated semiconductor device 200 can include one or more vertical FINs 1502 and 1506 formed on a silicon substrate 1504. As shown in FIG. 15, a hard mask 1508 and 1510 is formed over a first set of vertical FINs 1502 and a hard mask 1510 is formed over a second set of vertical FINs 1506.

Figure 16:
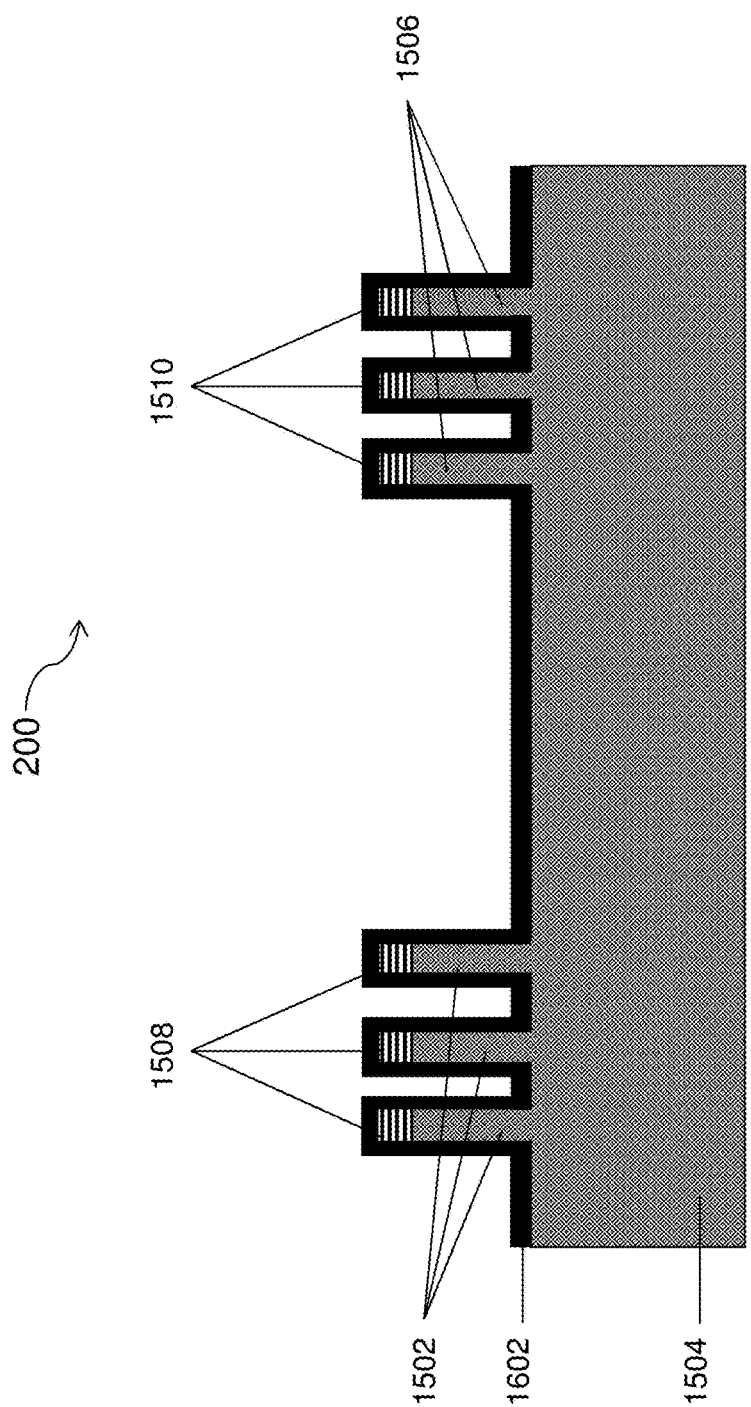

FIG. 16 depicts a cross-sectional view of the structure 200 after adding a bottom spacer 1602 over the substrate 1504. In one or more embodiments, the bottom spacer 1602 is a conforming liner and is formed in a similar manner as the bottom spacer 202 shown in FIG. 2.

Figure 17:
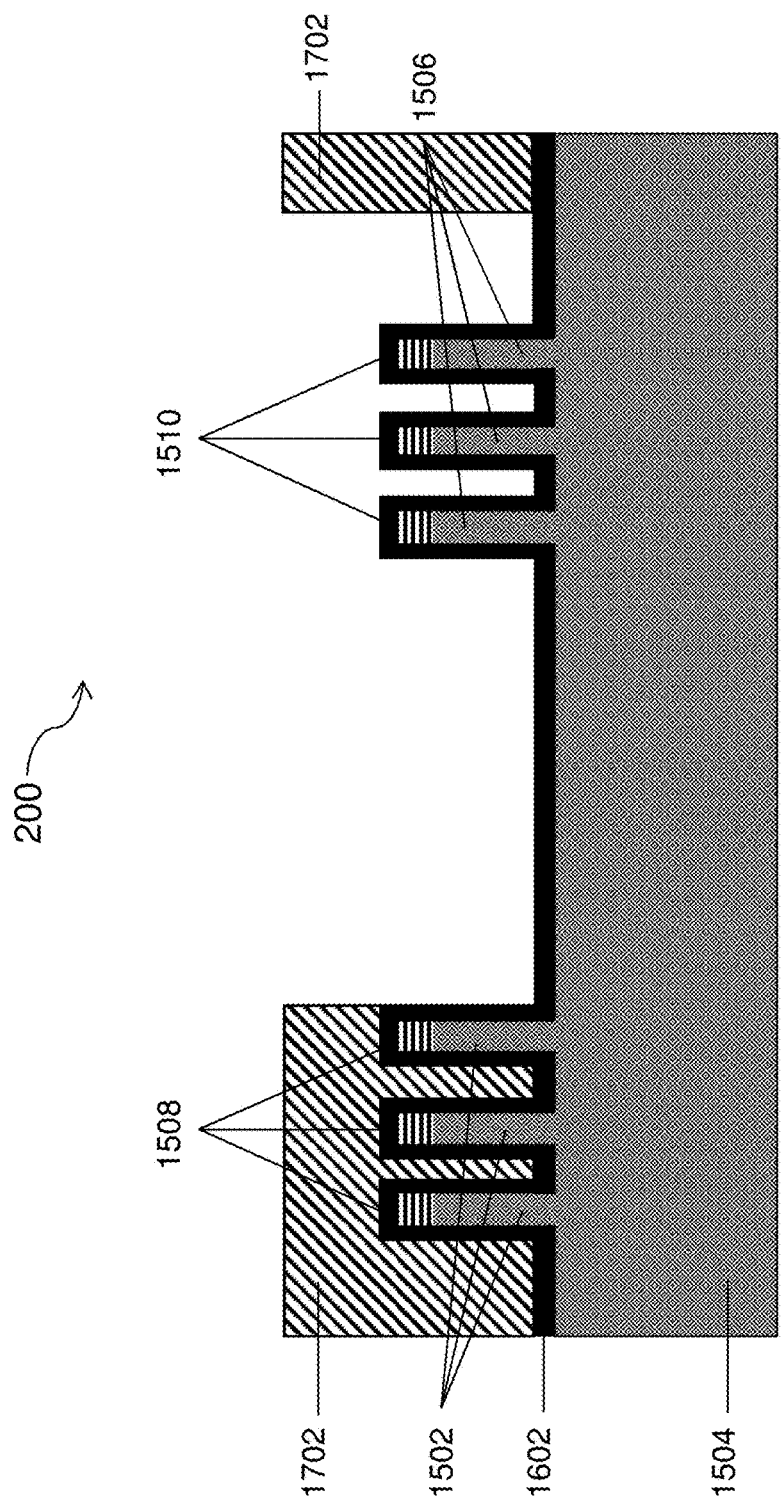

FIG. 17 depicts a cross-sectional view of the structure 200 after selectively patterning a block mask 1702 over one or more portions of the bottom spacer 1602.

Figure 18:
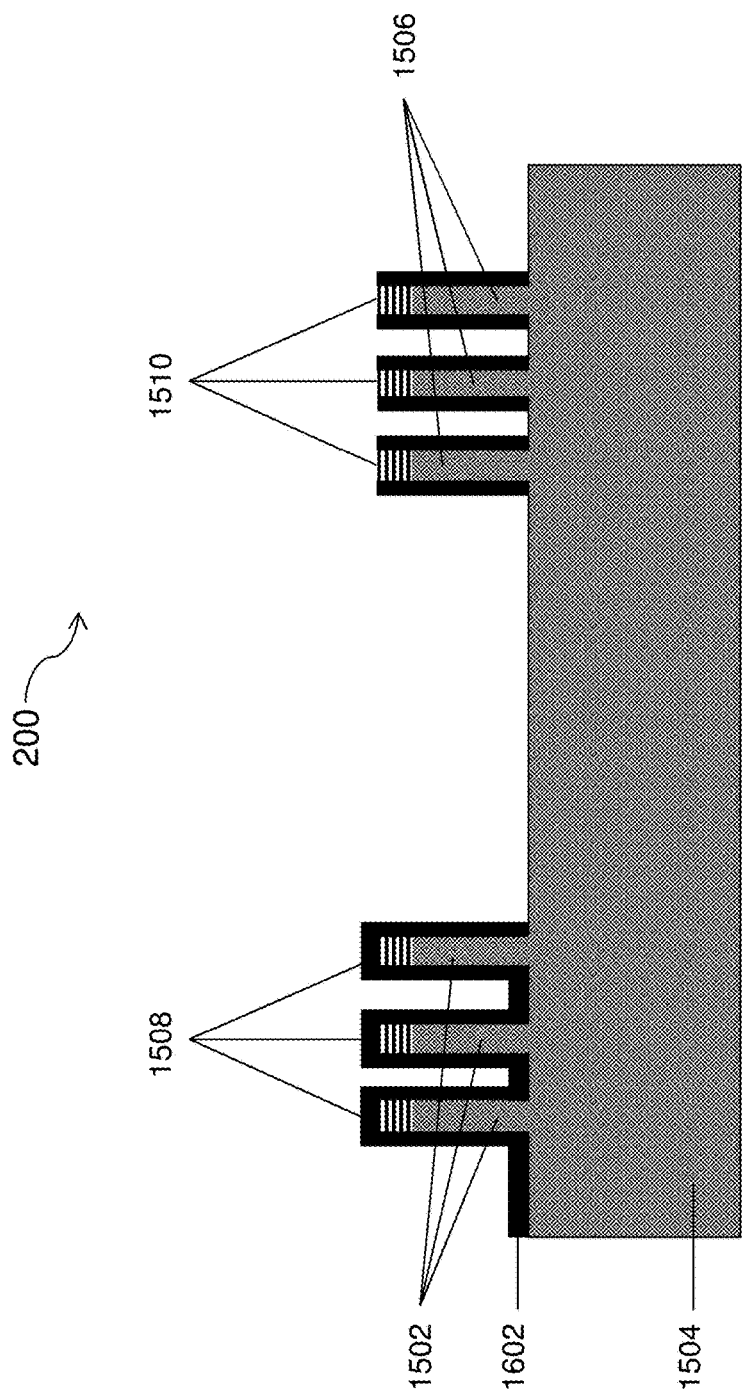

FIG. 18 depicts a cross-sectional view of the structure 200 after selectively removing the bottom spacer 1602 and the block mask 1702 from the substrate 1504. In one or more embodiments, the bottom spacer 1602 and the block mask 1702 are removed by spacer reactive ion etching (RIE).

Figure 19:
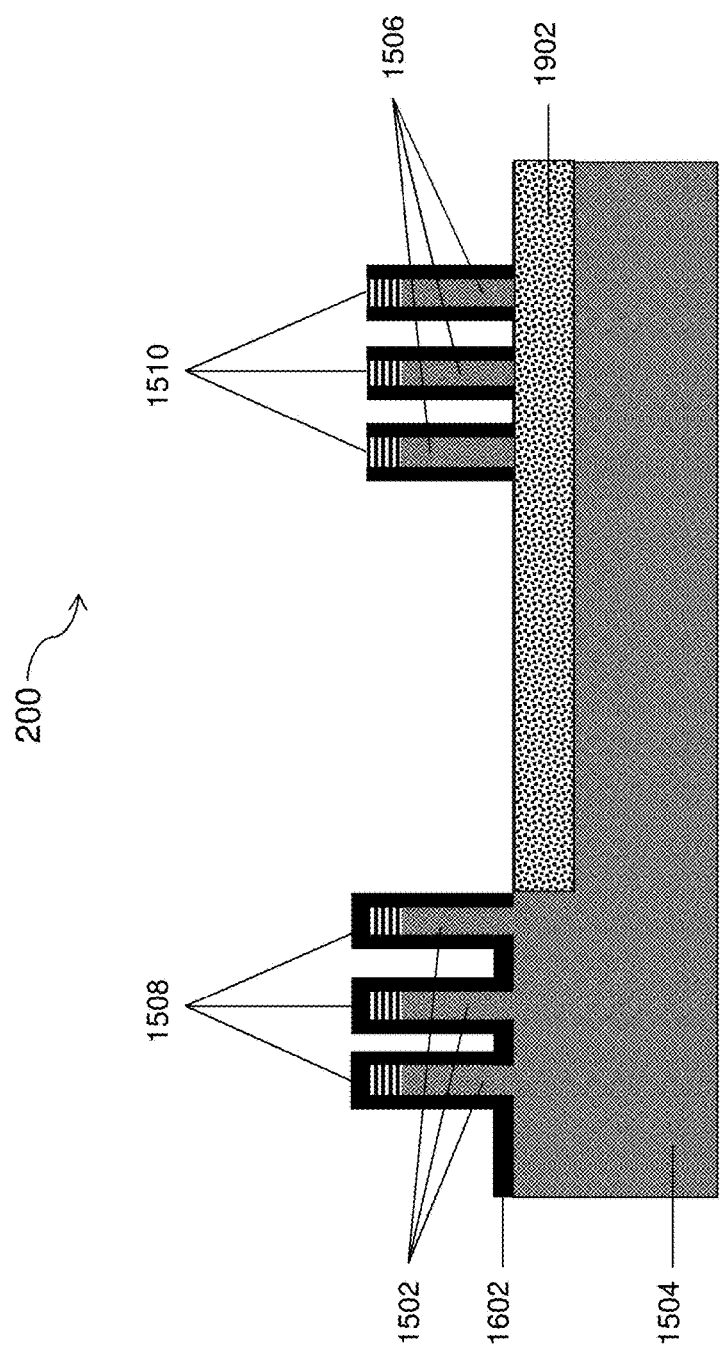

FIG. 19 depicts a cross-sectional view of the structure 200 after performing an ion implantation and anneal process producing layer 1902. In one or more embodiments, the layer 1902 is a heavily doped N+ implant region.

Figure 20:
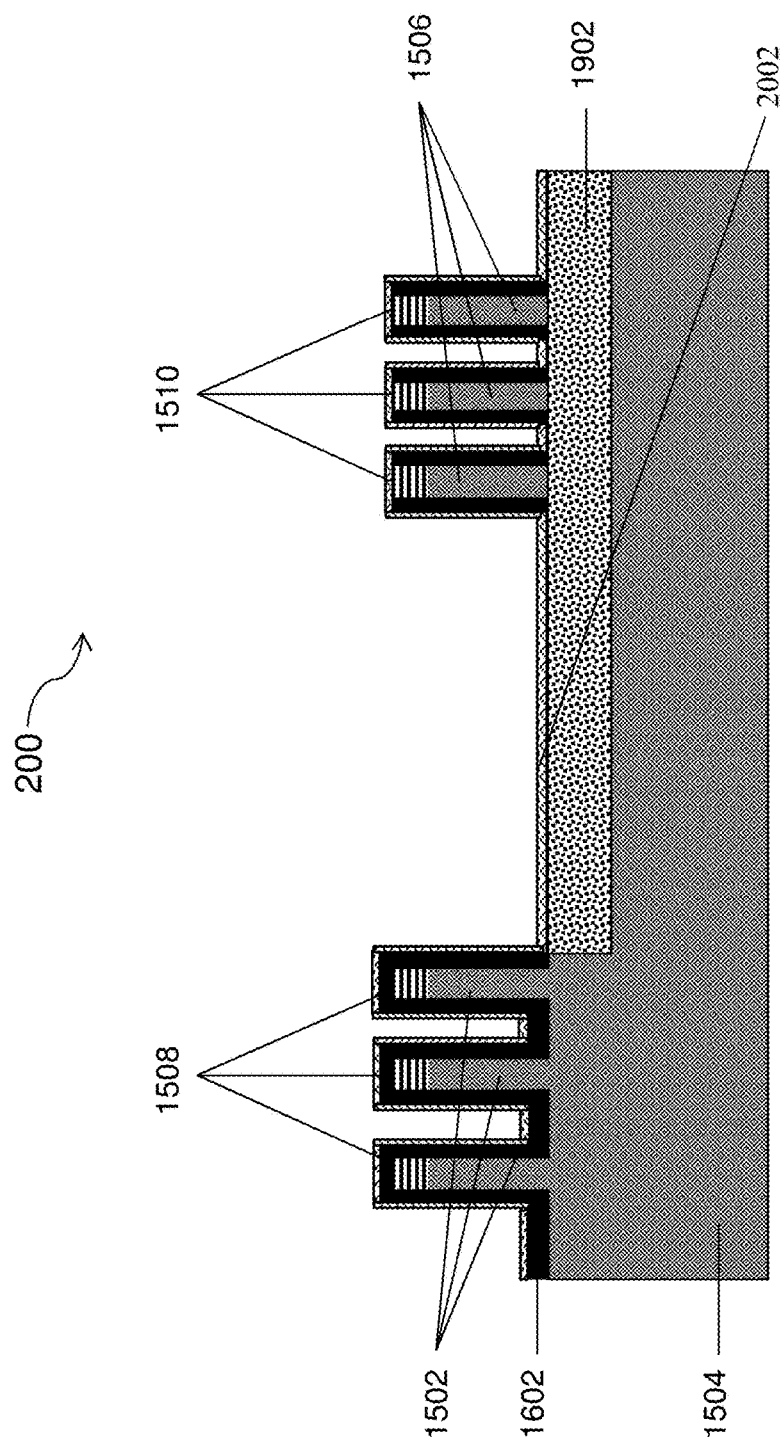

FIG. 20 depicts a cross-sectional view of the structure 200 after adding a dielectric layer 2002. In one or more embodiments, the dielectric film 2002 is a conformally deposited in a similar manner as the dielectric layer 602 shown in FIG. 6. The conforming dielectric film 2002 can be grown over the first set of FINs 1502, second set of FINs 1506, and in the channel between the first set of FINs 1502 and the second set of FINs 1506. In some embodiments, the dielectric film 2002 is formed by atomic layer deposition (ALD), and in some embodiments, the dielectric film 2002 is formed by chemical vapor deposition (CVD).

Figure 21:
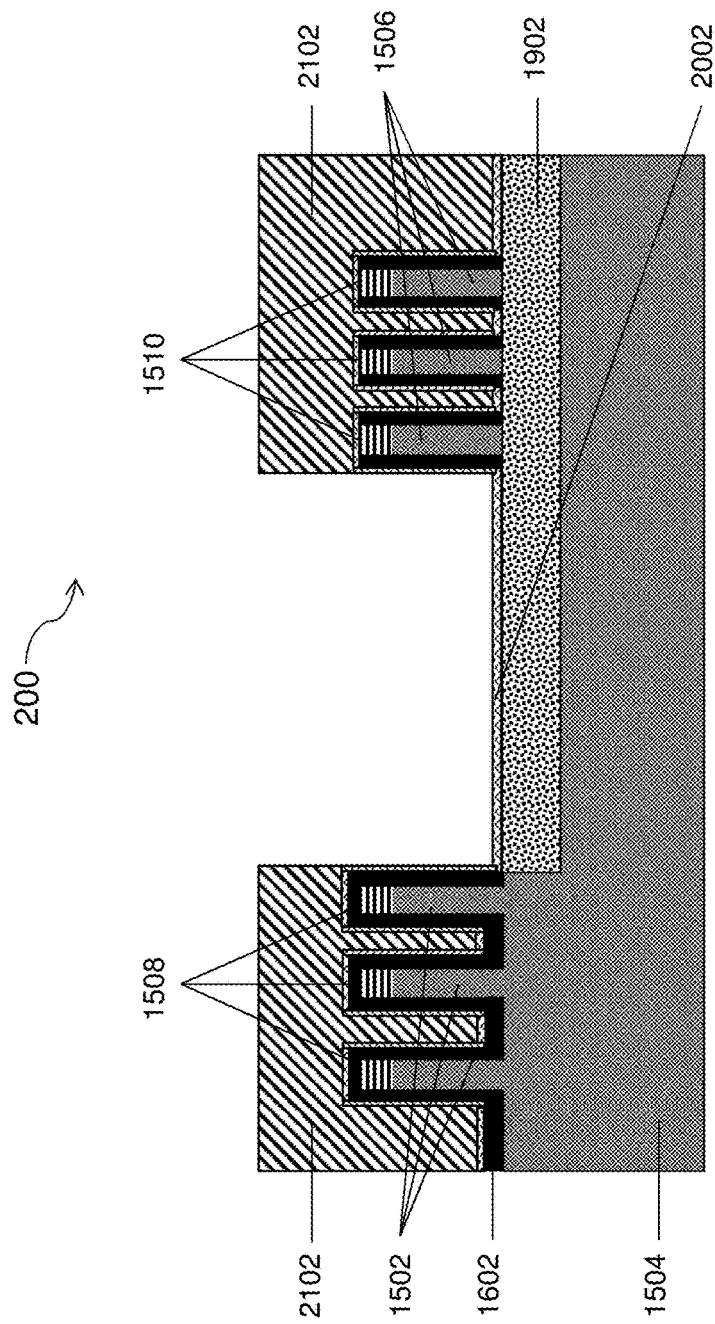

FIG. 21 depicts a cross-sectional view of the structure 200 after patterning a block mask 2102 over one or more portions of the substrate 1504. In one or more embodiments, the channel between the first set of FINs 1502 and the second set of FINs 1506 is left exposed for growing an epitaxial layer.

Figure 22:
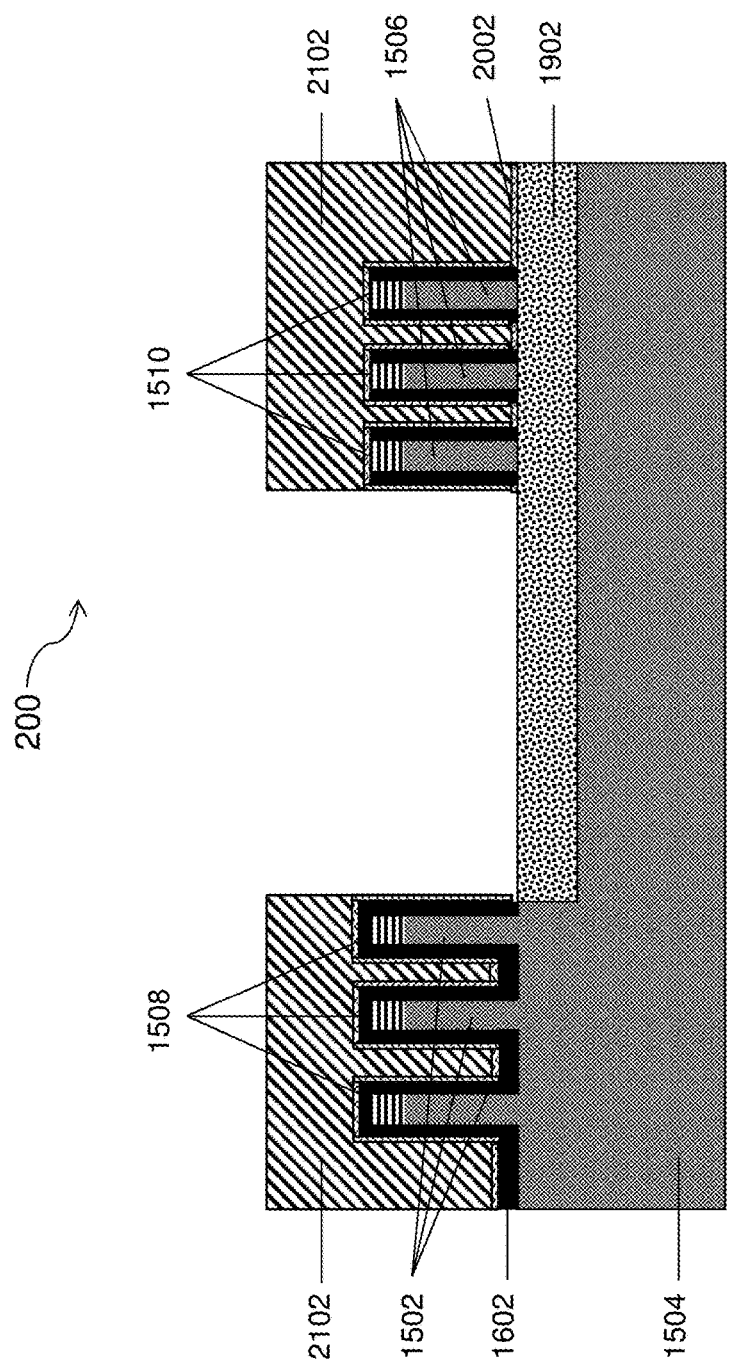

FIG. 22 depicts a cross-sectional view of the structure 200 after removing one or more portions of the dielectric film 2002 from the structure 200. In one or more embodiments, the dielectric film 2002 is removed in the channel formed between the first set of FINs 1502 and the second set of FINs 1506.

Figure 23:
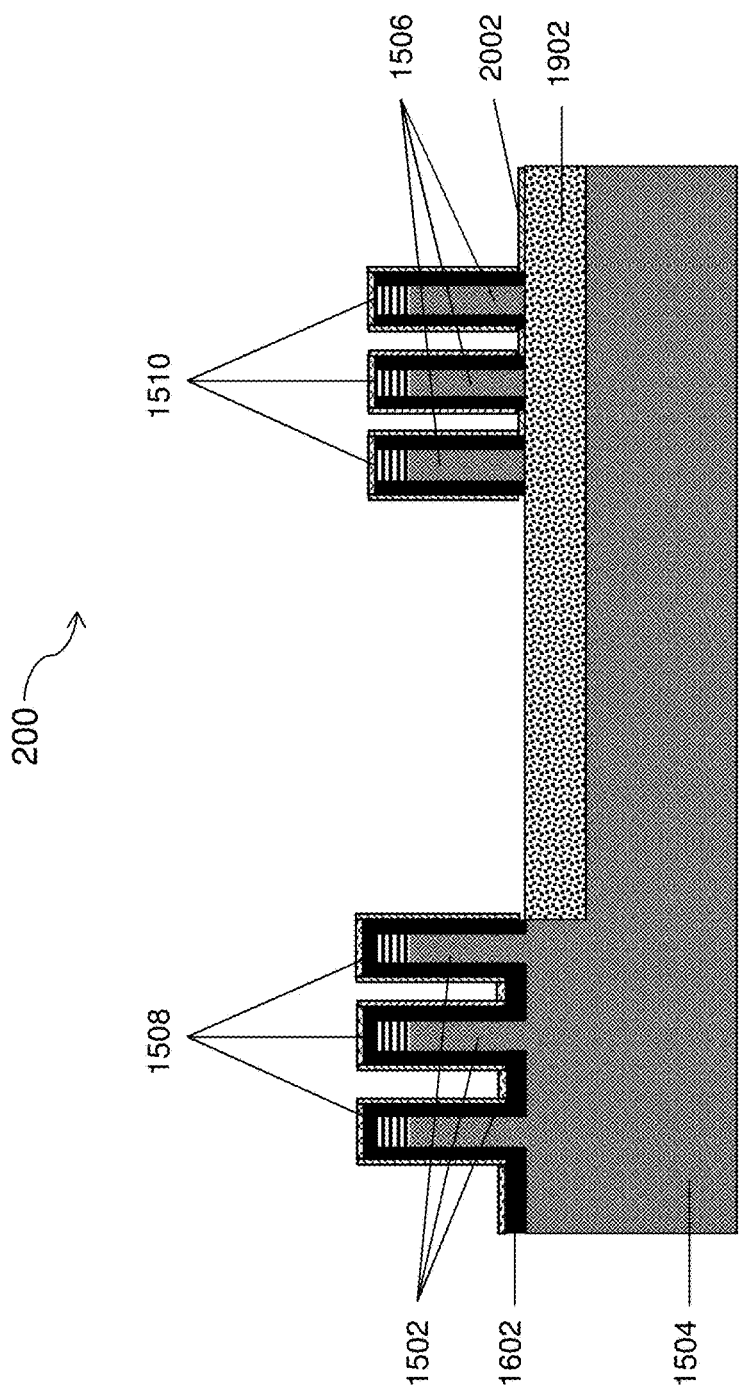

FIG. 23 depicts a cross-sectional view of the structure 200 after removing one or more portions of the block mask 2102.

Figure 24:
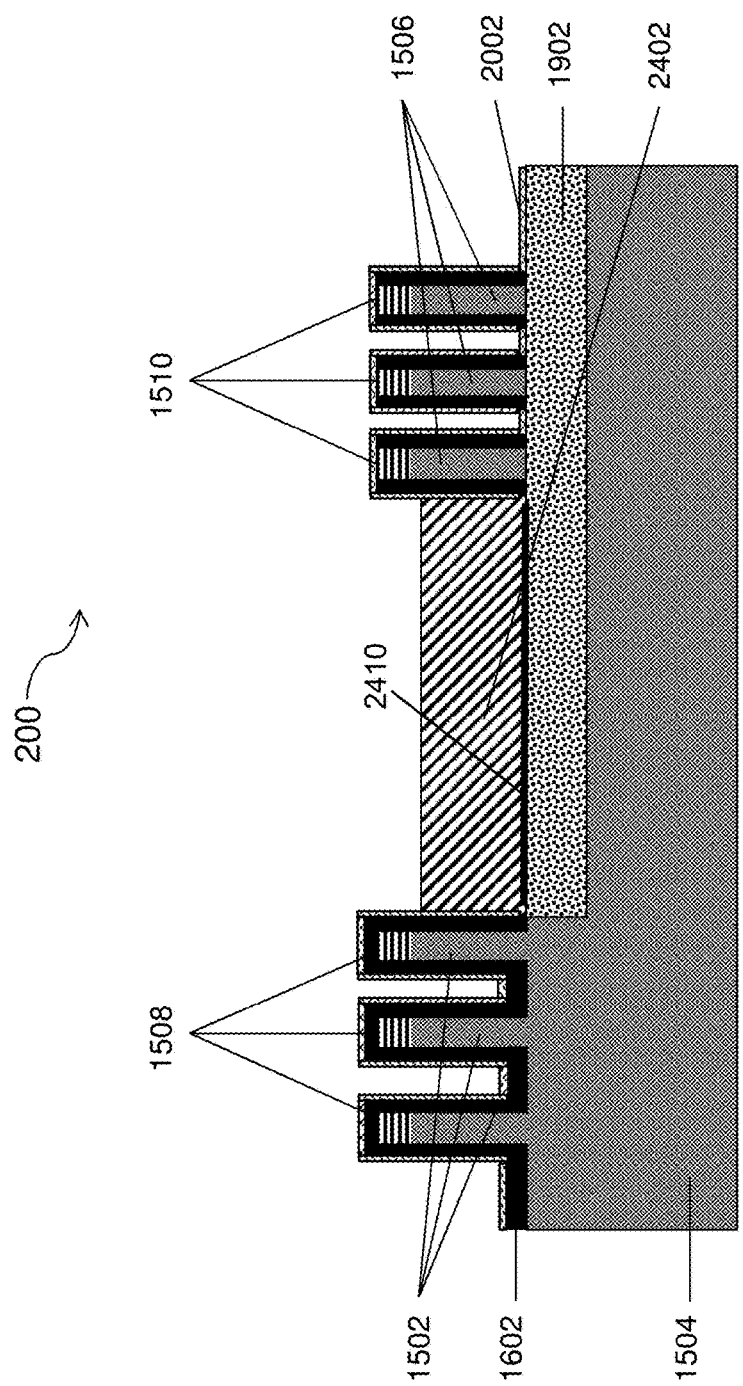

FIG. 24 depicts a cross-sectional view of the structure 200 after epitaxially growing a layer 2402 on the exposed regions of the substrate 1504. A PN junction is formed between the layer 1902 and the layer 2402. In one or more embodiments, an i-layer 2410 can be disposed between the layer 1902 and the layer 2402.

Figure 25:
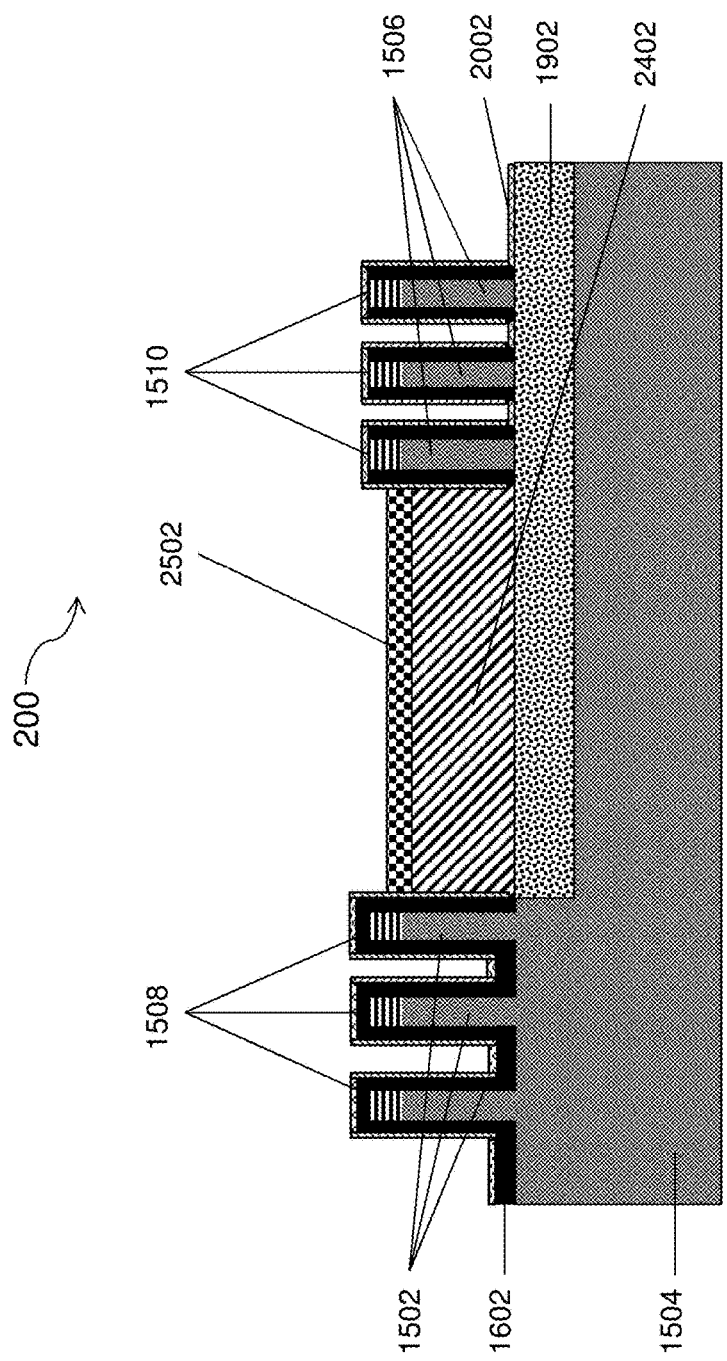
Figure 26:
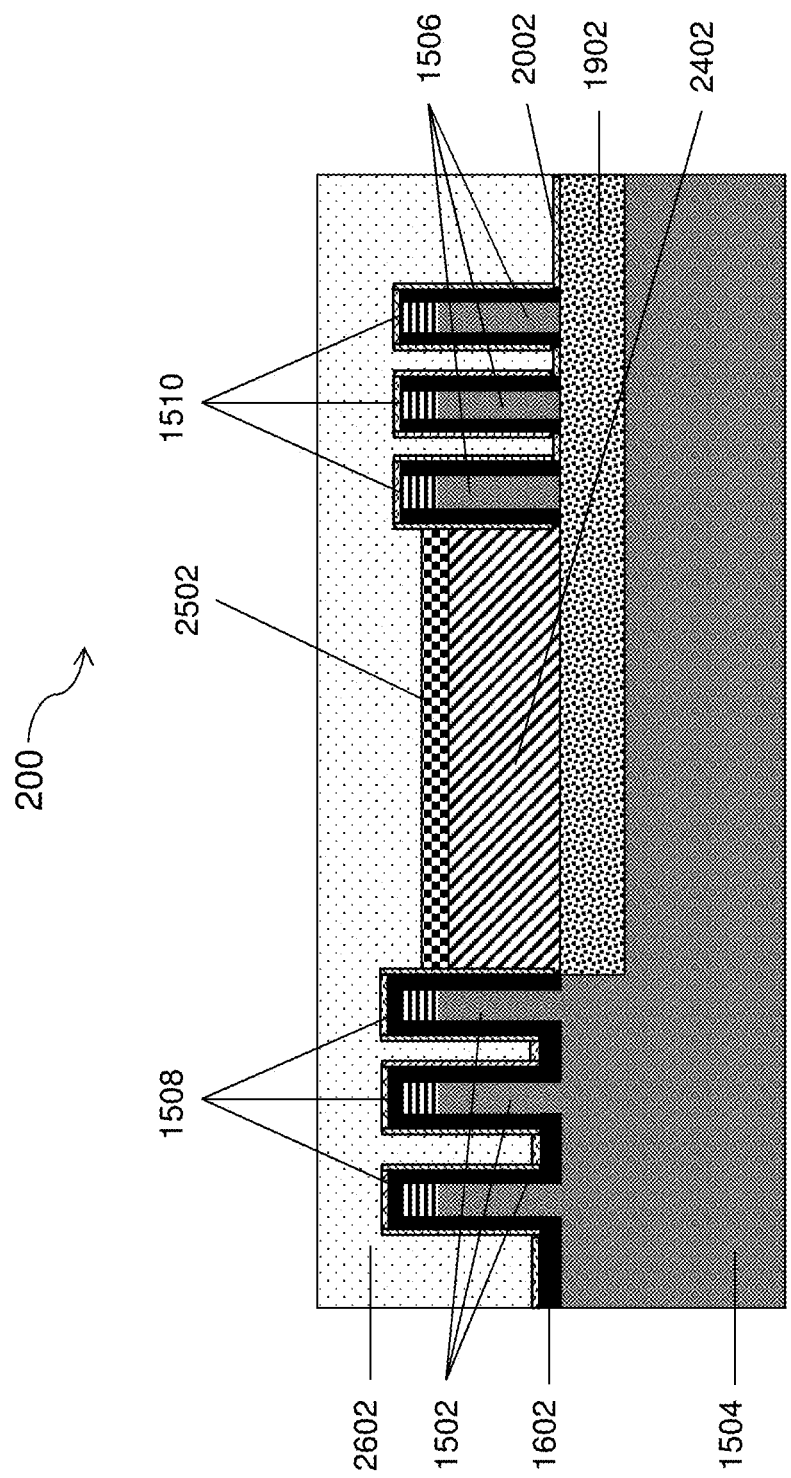

FIG. 25 depicts a cross-sectional view of the structure 200 after forming a silicide layer 2502 atop the layer 2402. In other embodiments, the silicide layer 2502 is only formed between the metal contacts described in FIG. 27 and the structure 1504. FIG. 26 depicts a cross-sectional view of the structure 200 after filling in the substrate 1504 with a dielectric 2602.

Figure 27:
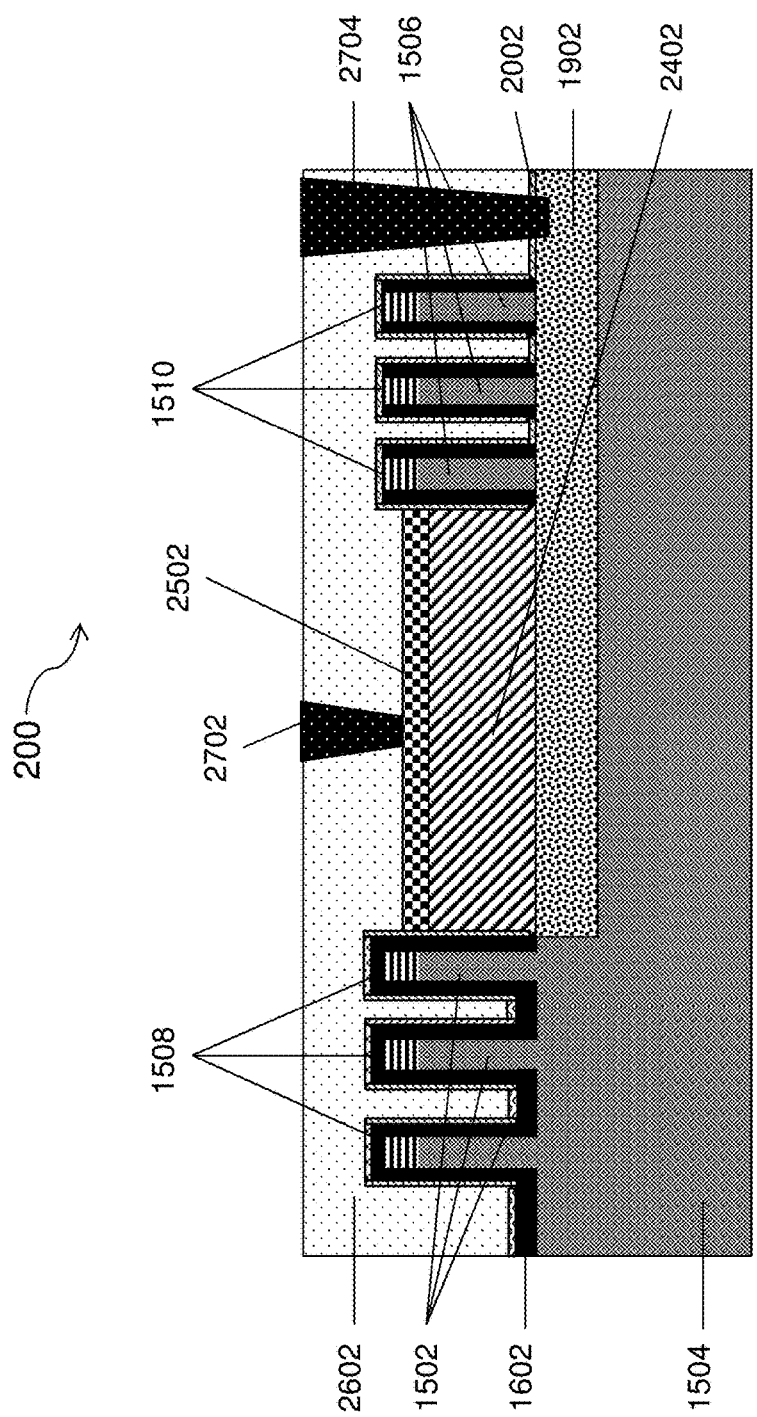

FIG. 27 depicts a cross-sectional view of the structure 200 after forming one or more trenches in the dielectric 2602 and forming one or more metal contacts 2702 and 2704 in the one or more trenches. In some embodiments, the metal contacts can serve as source, gate, or drain contacts. In other embodiments, a different number of metal contacts can be formed.

Figure 28:
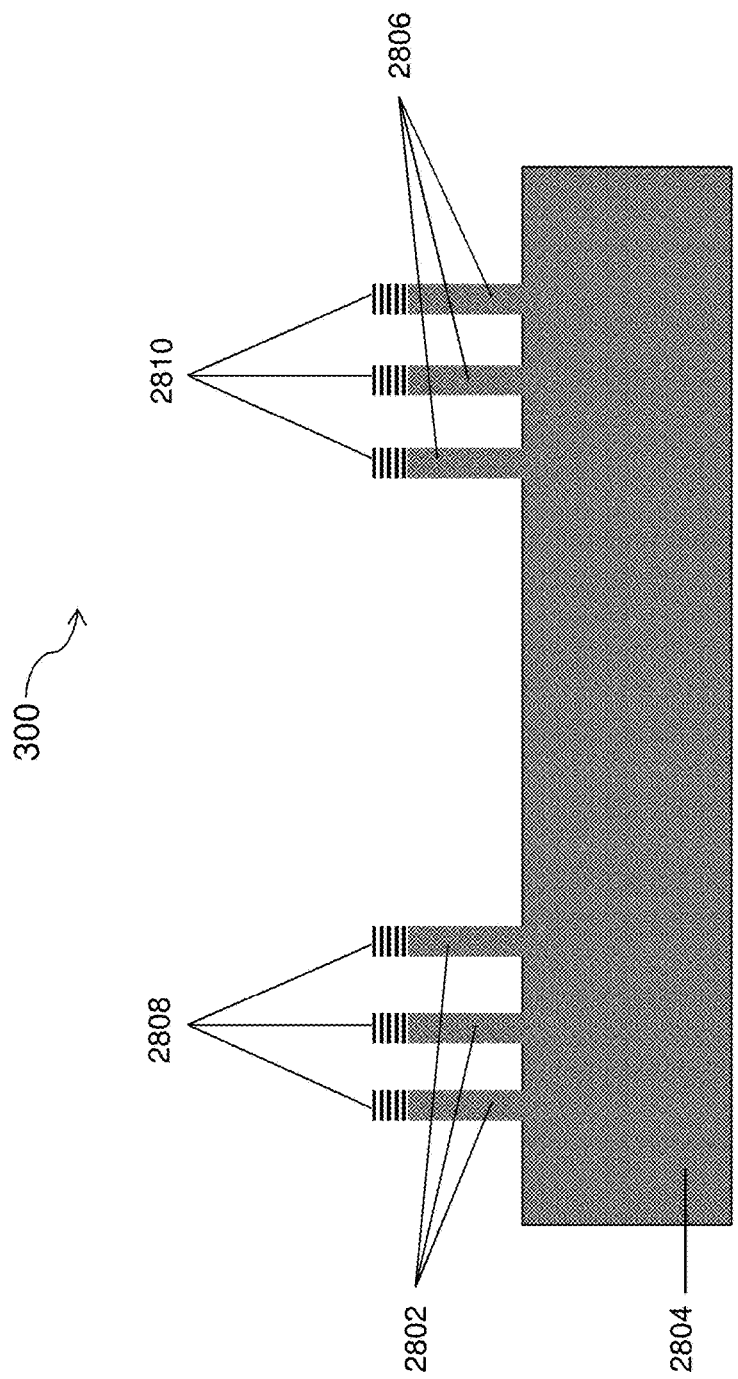
FIGS. 28-38 depict a cross-sectional view of a first embodiment of a semiconductor structure after various processing operations according to one or more embodiments of the inventions.

FIGS. 28-38 depict a cross-sectional view of forming a Schottky diode or transient voltage suppression (TVS) diode according to one or more embodiments. The TVS diode is formed as back to back Schottky diodes. In one or more embodiments, a Schottky diode which is FIN bounded edge formed, wherein the FINs are doped and used as guard rings. There is no parasitic conducting path in such structure for any shunt leakage vertically and/or laterally. As depicted in FIG. 28, a structure 300 is initially formed in a similar manner as the structure 100 depicted in FIG. 28 depicts a partially fabricated semiconductor device 300 can include one or more set of vertical FINs 2802 and 2806 formed on a silicon substrate 2804. Also depicted in FIG. 28 is a hard mask 2808 and 2810 atop the first set of FINs 2802 and the second set of FINs 2806.

Figure 29:
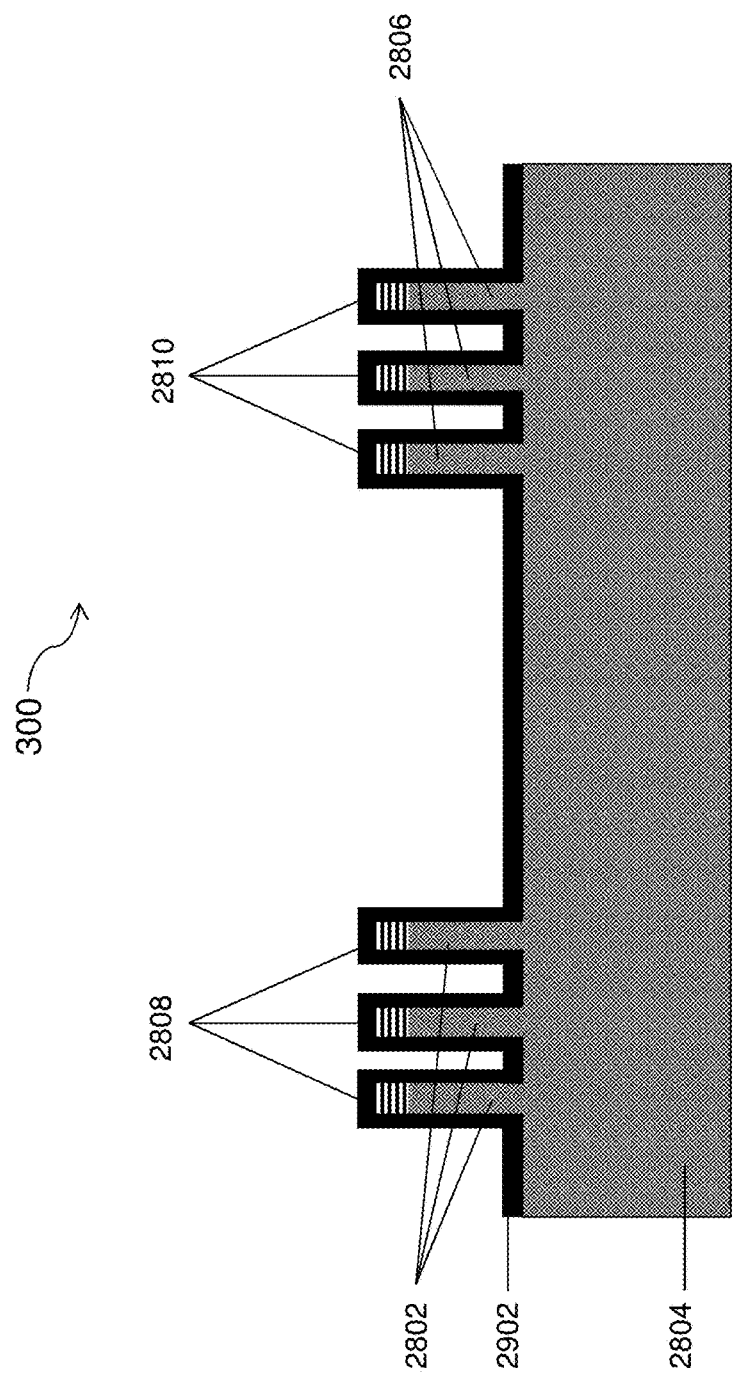

FIG. 29 depicts a cross-sectional view of the structure 300 after forming a bottom spacer 2902 over the structure 300. In one or more embodiments, the bottom spacer can be formed in a similar manner as the bottom spacer 202 of FIG. 2.

Figure 30:
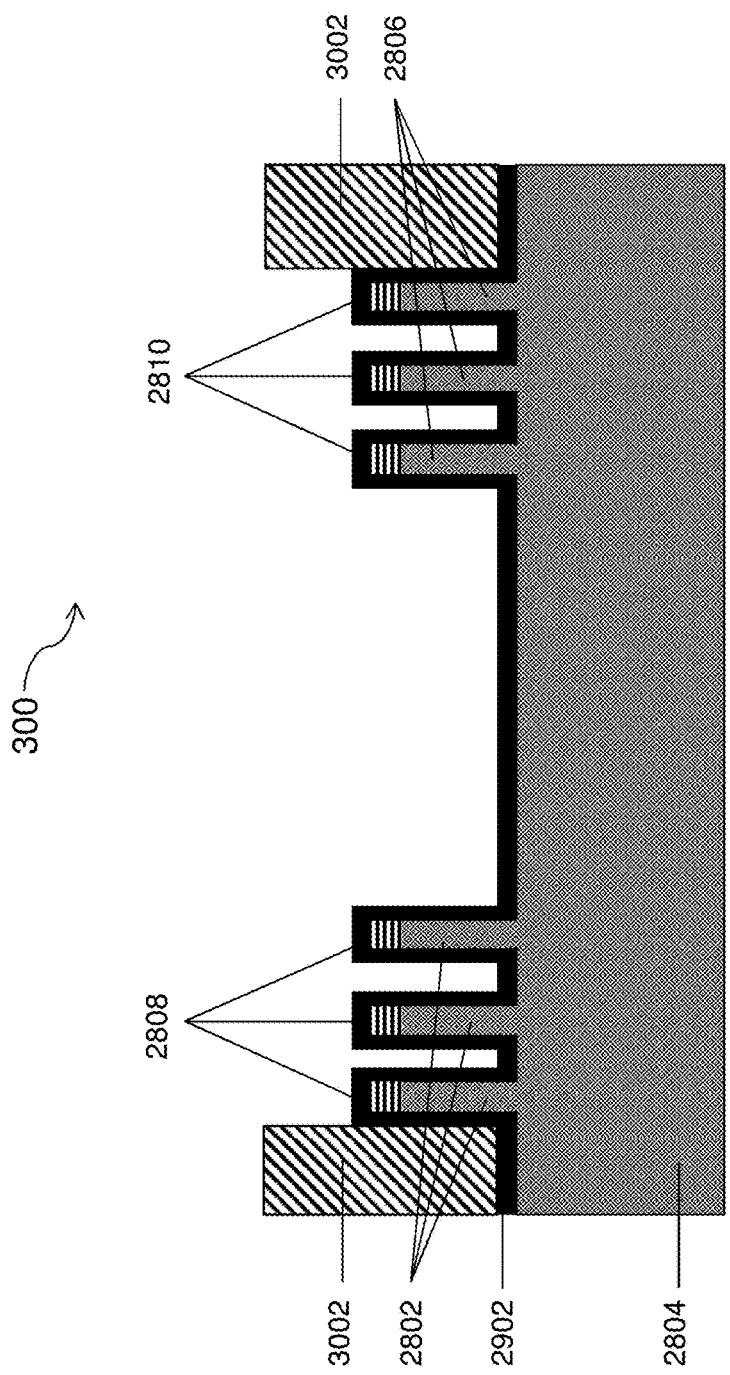

FIG. 30 depicts a cross-sectional view of the structure 300 after selectively patterning a block mask 3002 over one or more portions of the bottom spacer 2902 of the structure 300.

Figure 31:
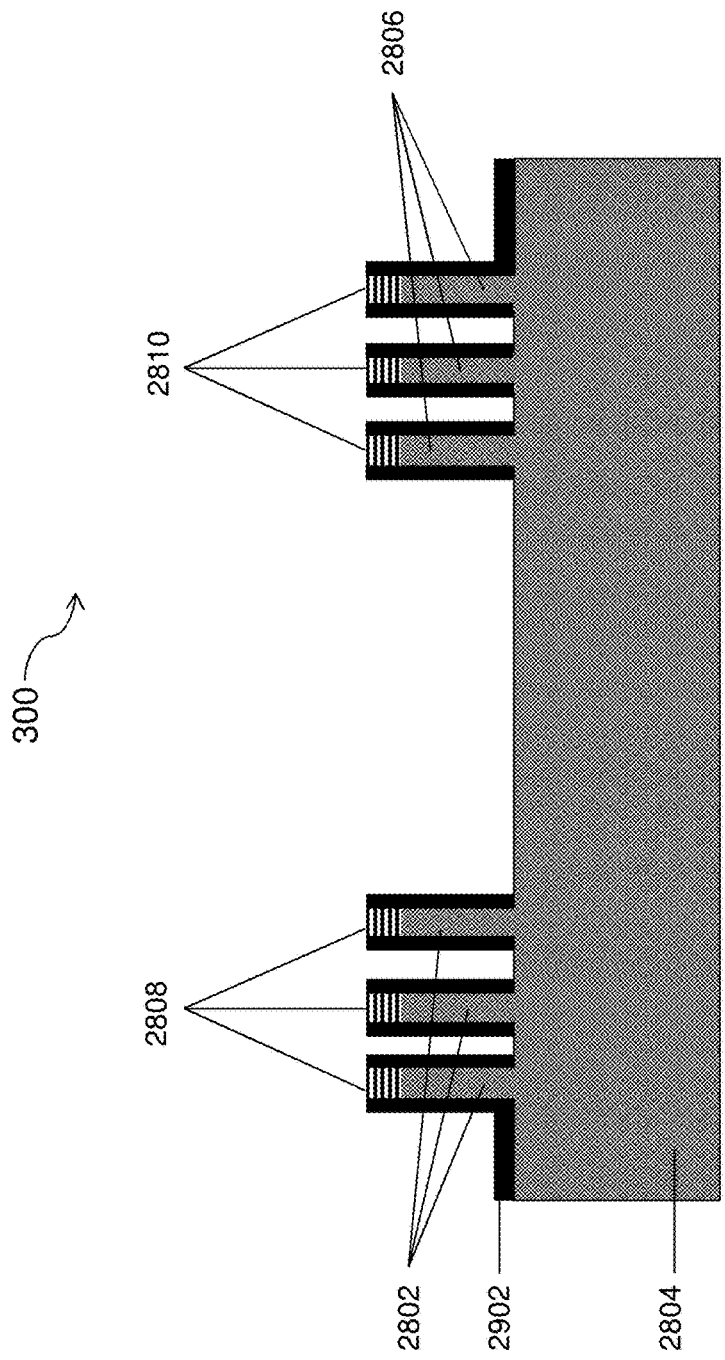

FIG. 31 depicts a cross-sectional view of the structure 300 after selectively removing the block mask 3002 and one or more portions of the bottom spacer 2902 to expose one or more portions of the structure 300. In an embodiment, the one or more exposed portions include a channel between the first set of FINs 2802 and the second set of FINs 2806. In addition, the one or more exposed portions can include a portion of the set of FINs 2802 and 2806.

Figure 32:
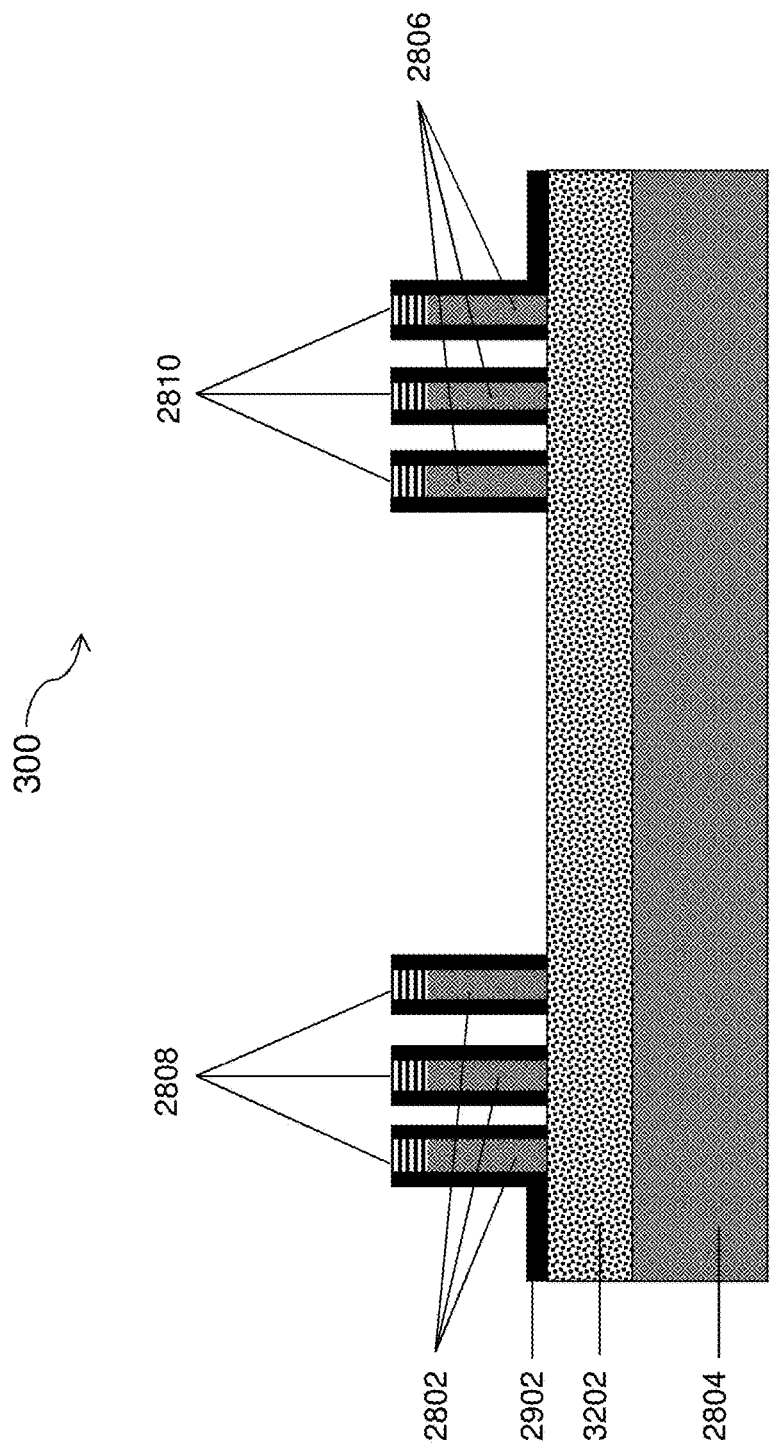

FIG. 32 depicts a cross-sectional view of the structure 300 after performing a doping process to produce a first doping layer 3202. In some embodiments, the layer 3202 is ion implanted and annealed layer. In one or more embodiments, the doping layer 3202 is an N+ doping layer. In some embodiments, the Schottky diode well doping is shared with the FET well, such as an N-type well. The doping concentration is lower than $10^{18}$ $cm^{-3}$ to avoid ohmic contact formation. In other embodiments, the doping layer 3202 is a P+ doping layer.

Figure 33:
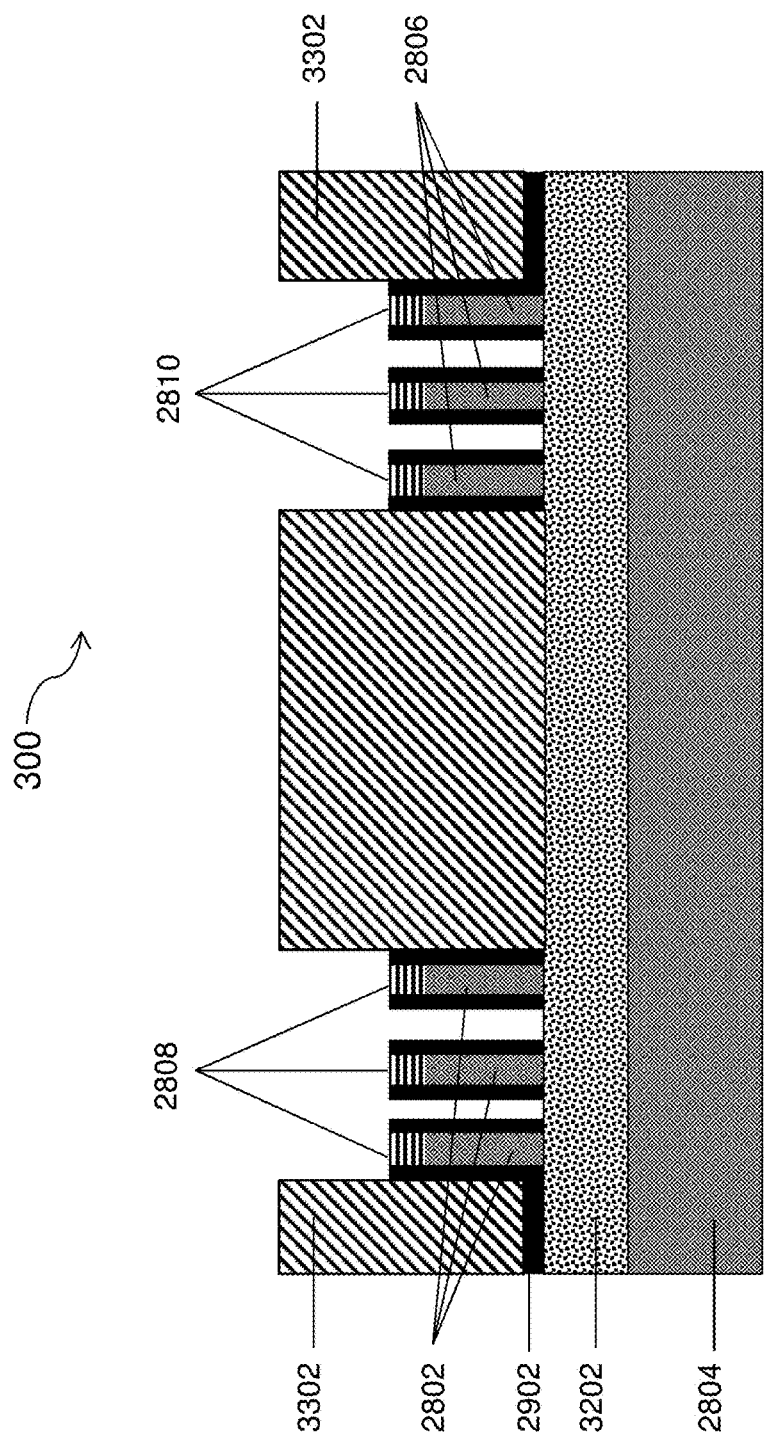

FIG. 33 depicts a cross-sectional view of the structure 300 after patterning a second block mask 3302 over one or more portions of the structure 300. In some embodiments, the second block mask 3302 leaves portions of the first set of FINs 2802 and second set of FINs 2806 exposed. It is to be understood that different block mask patterns can be used.

Figure 34:
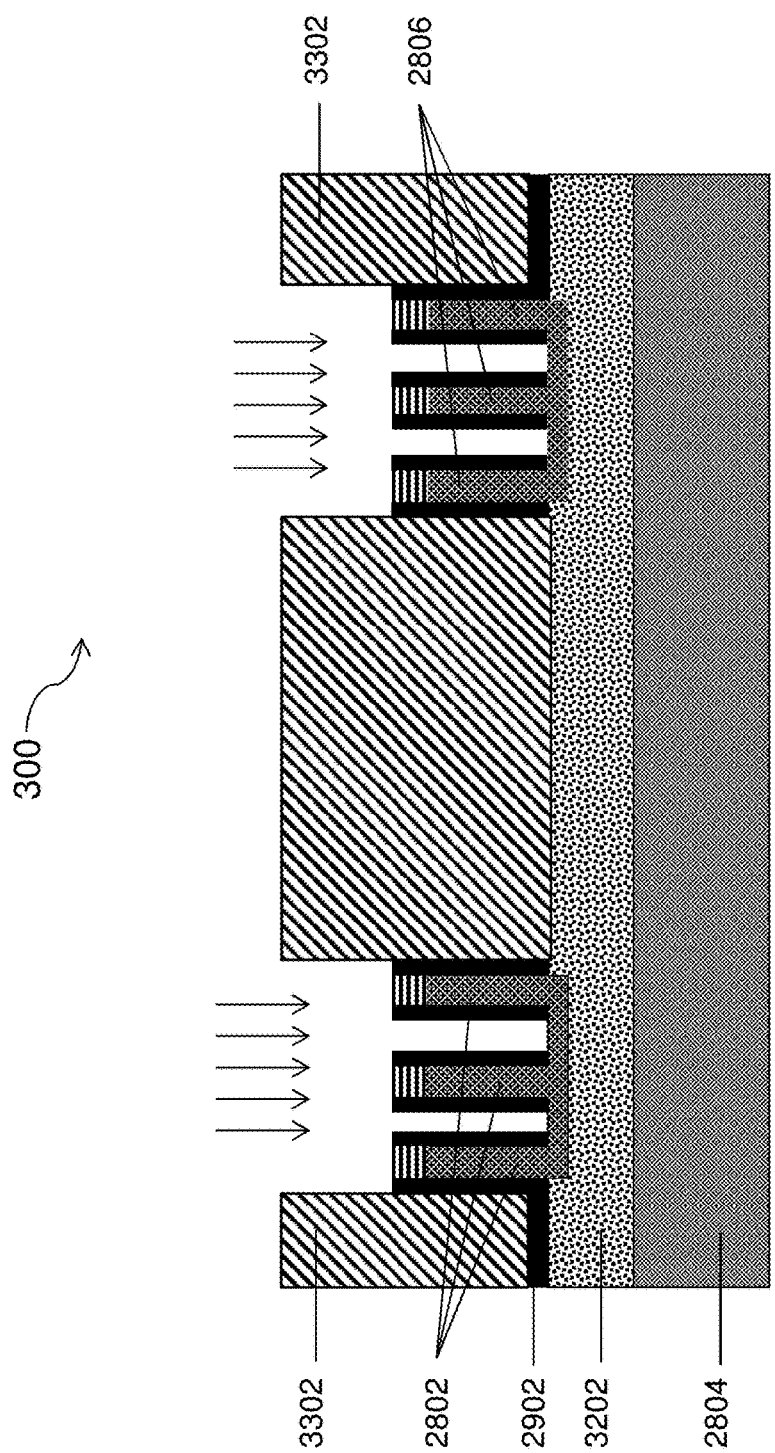

FIG. 34 depicts a cross-sectional view of the structure 300 after performing a doping process. In one or more embodiments, the set of FINs 2802 and 2806 are doped as depicted by a set of arrows depicted in FIG. 30. In some embodiments, the set of FINs 2802 and 2806 are p-type doped, for the guard ring formation.

Figure 35:
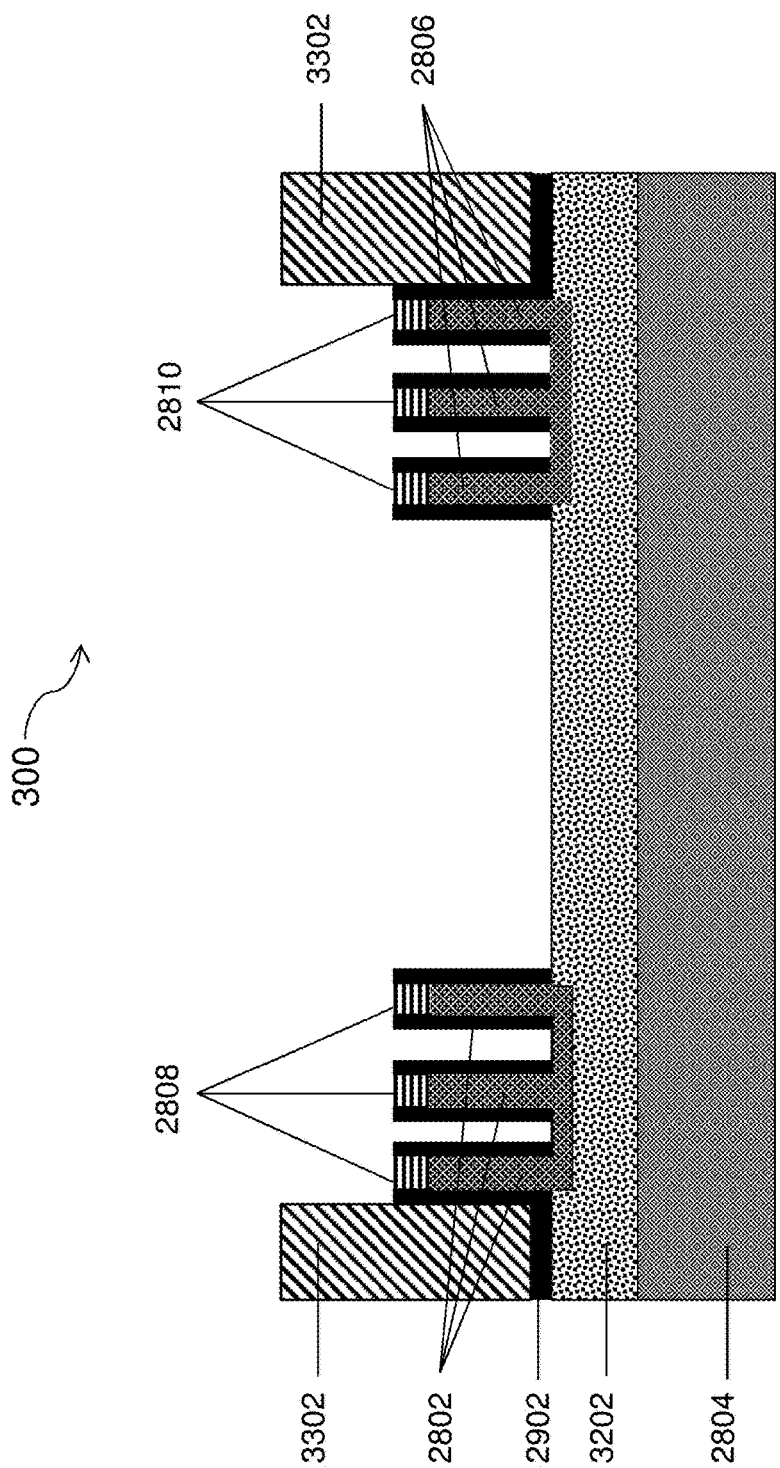

FIG. 35 depicts a cross-sectional view of the structure 300 after removing one or more portions of the second block mask 3302 to expose one or more portions of the substrate 2804.

Figure 36:
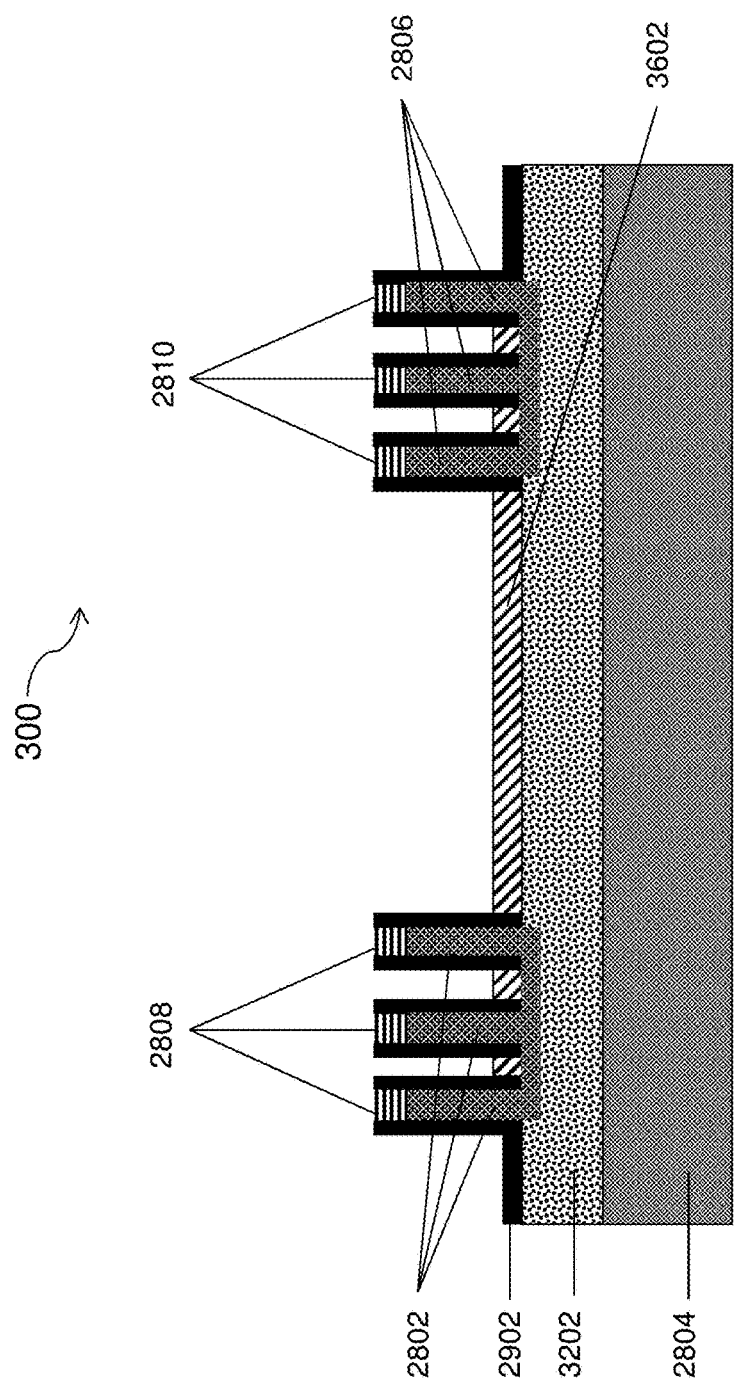

FIG. 36 depicts a cross-sectional view of the structure 300 after forming a silicidation layer 3602 over one or more portions of the substrate 2404. In one or more embodiments, the silicidation layer 3602 is formed over the channel between the set of FINs 2802 and 2806. The silicide formation that is formed on top of the well, which is between the set of FINs 2802 and 2806, which act as a guard ring. The diode area can be configured for large ESD current purging.

Figure 37:
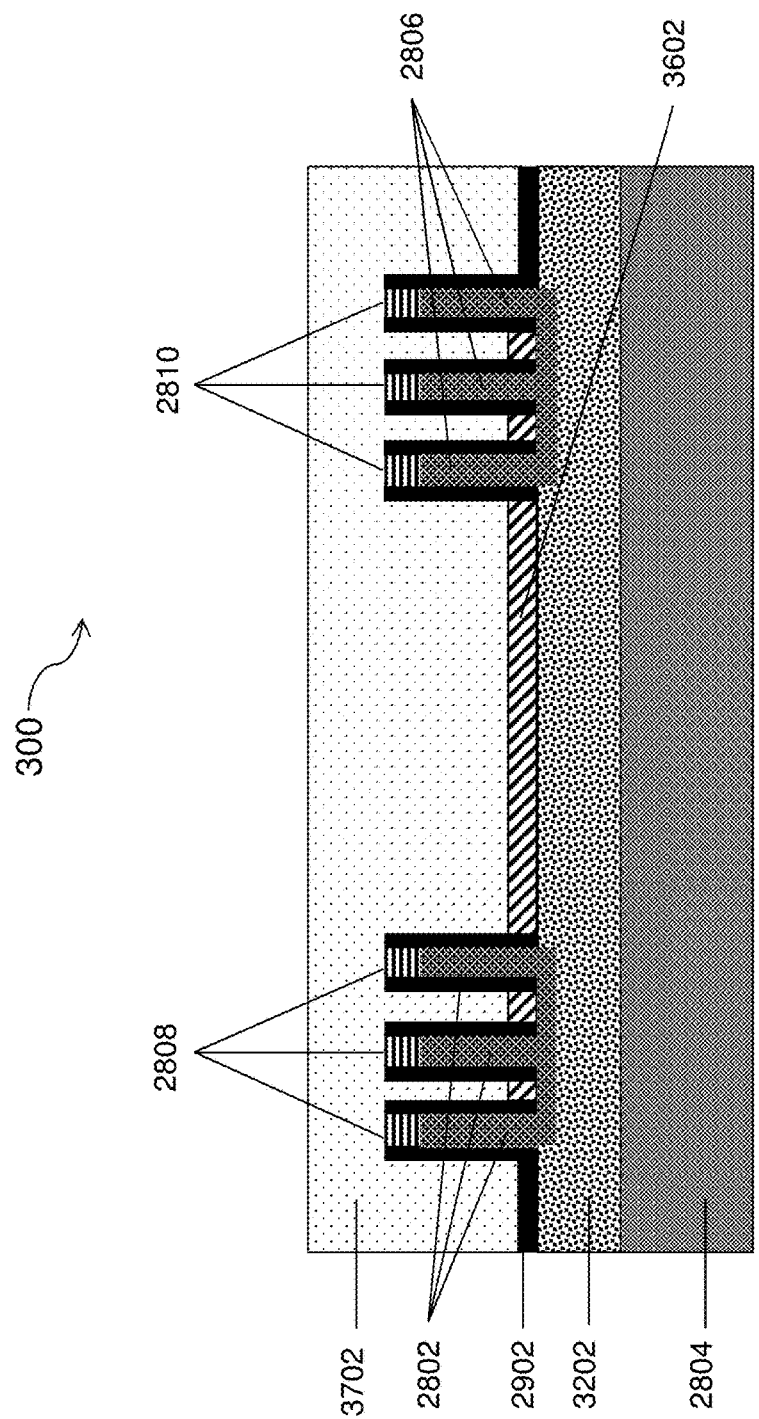

FIG. 37 depicts a cross-sectional view of the structure 300 after filling the structure 300 with a dielectric material 3702.

Figure 38:
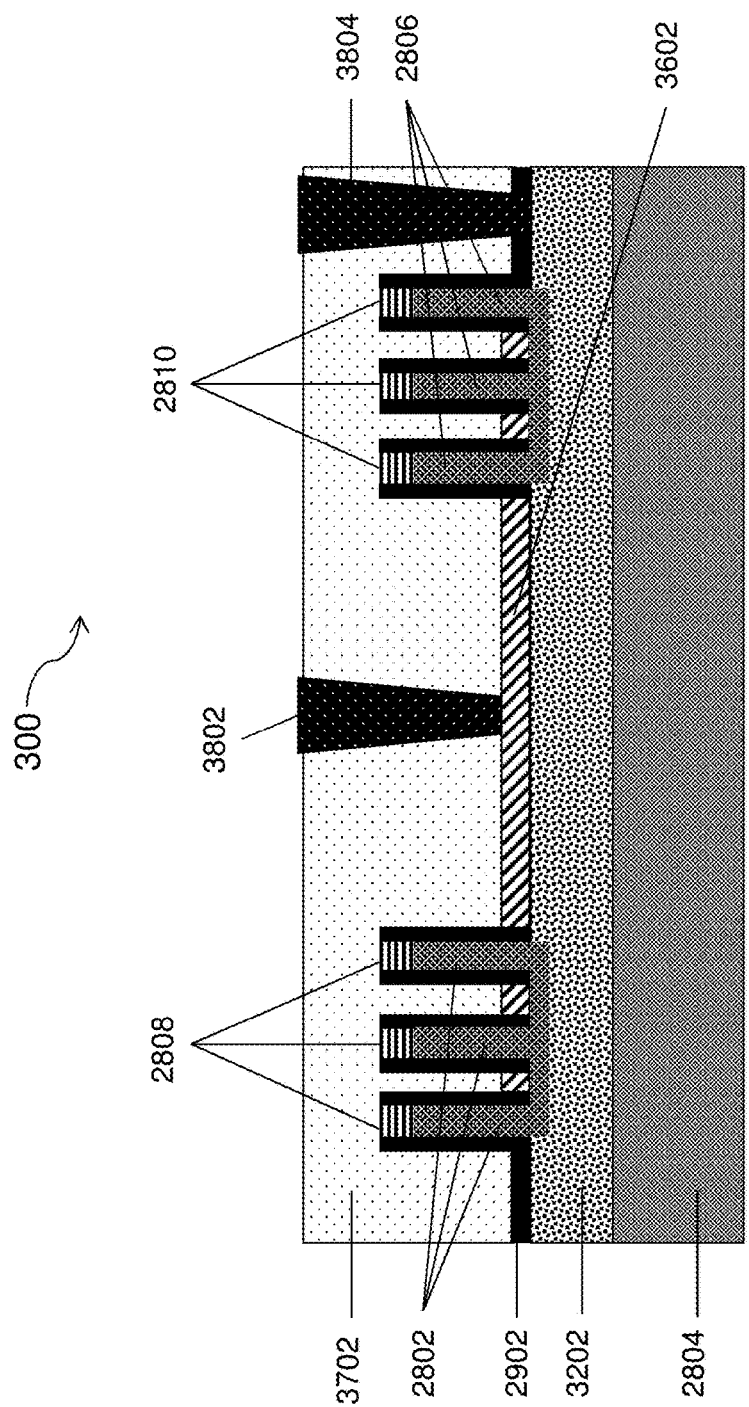

FIG. 38 depicts a cross-sectional view of the structure 300 after forming trenches and forming one or more contacts 3802 and 3804.

Figure 39:
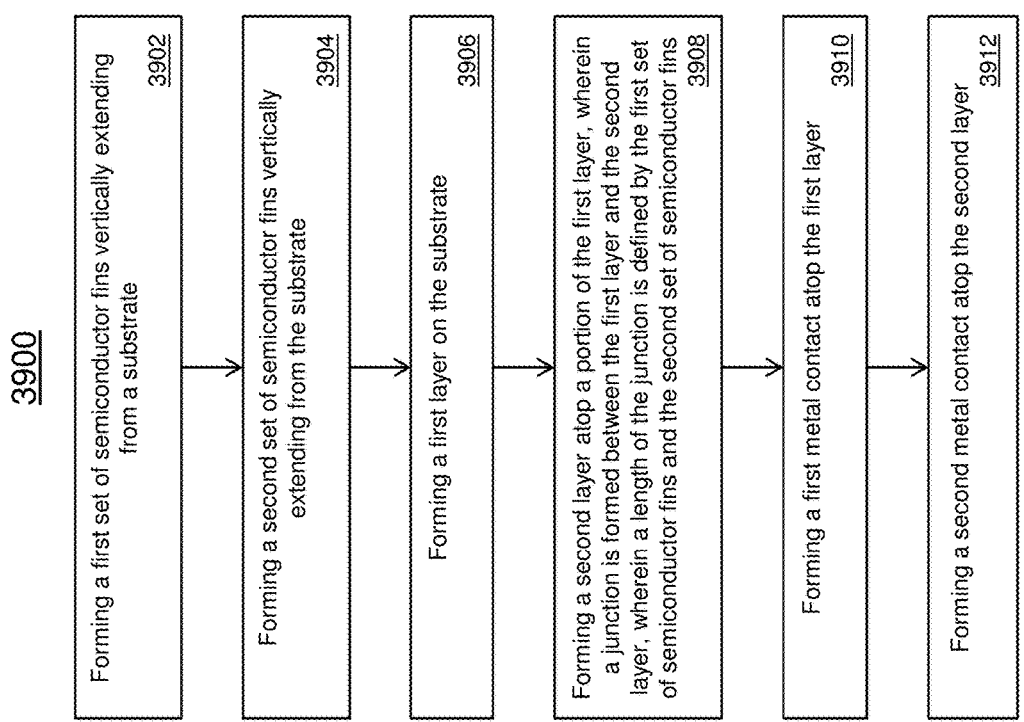
FIG. 39 depicts a flow chart for making vertical fin CMOS technology for electrostatic discharge protection.

Now referring to FIG. 39, a flowchart 3900 for forming a semiconductor device in accordance with one or more embodiments is shown. Block 3902 provides forming a first set of semiconductor FINs vertically extending a substrate. Block 3904 provides forming a second set of semiconductor FINs vertically extending from the substrate.

Block 3906 provides forming a first layer on the substrate. Block 3908 provides forming a second layer atop a portion of the first layer, wherein a junction is formed between the first layer and the second layer, wherein a length of the junction is defined by the first set of semiconductor FINs and the second set of semiconductor FINs.

Block 3910 provides forming a first metal contact atop the first layer. Block 3912 provides forming a second metal contact atop the second layer.

Figure 40:
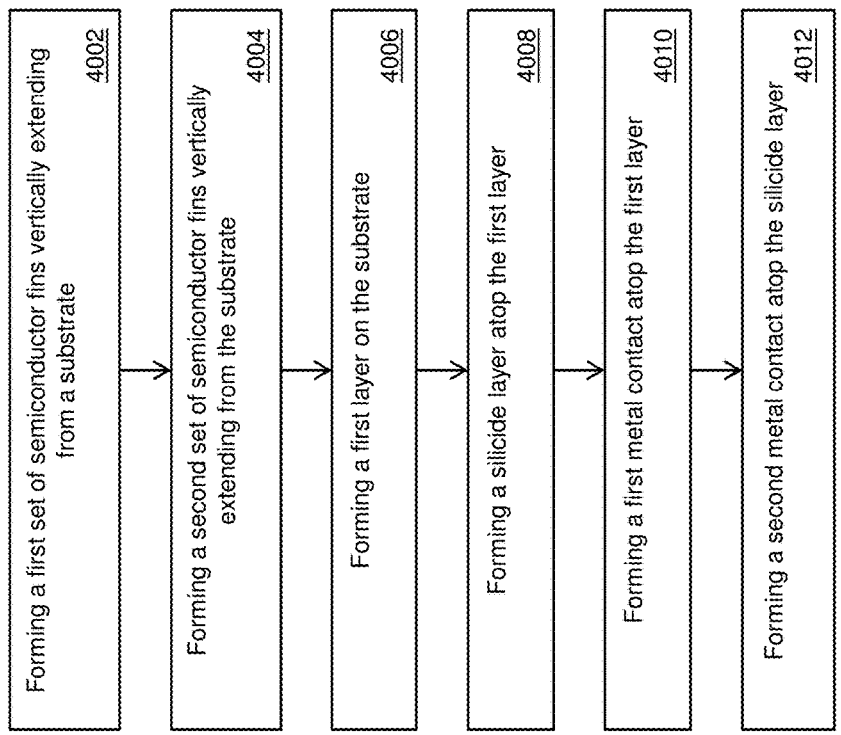
FIG. 40 depicts a flow chart for making vertical fin CMOS technology for electrostatic discharge protection.

Now referring to FIG. 40, a flowchart 4000 for forming a semiconductor device in accordance with one or more embodiments is shown. Block 4002 provides forming a first set of semiconductor FINs vertically extending from a substrate. Block 4004 provides forming a second set of semiconductor FINs vertically extending from the substrate.

Block 4006 provides forming a first layer on the substrate. Block 4008 provides forming a silicide layer atop the first layer. Block 4010 provides forming a first metal contact atop the first layer. Block 4012 provides forming a second metal contact atop the second layer.

One or more embodiments improves over the prior art by using FINs to bound the PN junction to create an accurately defined PN junction length and epitaxial growth to accurately create the PN junction of the diode for ESD protection. The configuration allows for a threshold breakdown voltage to be configured that is sufficient enough to trigger the electrostatic device and the PN junction which has been precisely formed can efficiently respond to the ESD event. The techniques described herein overcome the challenges of PN junctions being formed using ion implantation, where the ion implantation can lead to channeling effects in the PN junctions leading to performance issues. These performance issues can lead to slow response times to the ESD event and cause damage. The ESD devices generated by the techniques described herein provide for reliable protection of the coupled devices. In addition, the integrity of the operation of the coupled devices and electronics is increased.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming a semiconductor device, the method comprising:
    forming a first set of semiconductor fins vertically extending from a substrate;
    forming a second set of semiconductor fins vertically extending from the substrate;
    forming a first layer on the substrate;
    forming a second layer atop a portion of the first layer, wherein a junction is formed between the first layer and the second layer, wherein a length of the junction is defined by the first set of semiconductor fins and the second set of semiconductor fins;
    forming a first metal contact atop the first layer; and
    forming a second metal contact atop the second layer, wherein an i-layer is formed between the first layer and the second layer to form a PiN diode, wherein a height of the i-layer can be configured to set a breakdown voltage of the semiconductor device.

2. The method of claim 1, wherein the first layer is an epitaxially grown layer.

3. The method of claim 1, wherein the first layer is an ion implanted layer.

4. The method of claim 1, wherein the first layer is an n-type layer and the second layer is a p-type layer.

5. The method of claim 1, wherein doping the first layer and second layer to a doping concentration to less than $10^{20}$ cm$^3$.

6. The method of claim 1, wherein the first metal contact is an N+ ohmic contact and the second metal contact is a P+ ohmic contact, wherein the first metal contact and the second metal contact are separated by the first set of fins or the second set of fins.

7. The method of claim 1, wherein forming the first set of semiconductor fins further comprises forming a layer atop the first set of semiconductor fins or the second set of semiconductor fins.

8. The method of claim 1, further comprising forming a bottom spacer between the substrate and a bulk dielectric.

9. The method of claim 1, further comprising forming a second spacer between the substrate and a bulk dielectric.

10. The method of claim 1, further comprising forming a silicide layer between the first metal contact and substrate and forming another silicide layer between the second metal contact and substrate.

11. The method of claim 1, wherein forming the first set of semiconductor fins or the second set of semiconductor fins further comprises implanting dopants into the first set of semiconductor fins or the second set of semiconductor fins.

12. A method of forming a semiconductor device, the method comprising:
    forming a first set of semiconductor fins vertically extending from a substrate;
    forming a second set of semiconductor fins vertically extending from the substrate;
    forming a first layer on the substrate, wherein the first layer is formed by ion implantation;
    forming a silicide layer atop the first layer;
    forming a first metal contact atop the first layer; and
    forming a second metal contact atop the silicide layer, wherein an i-layer is formed between the first layer and the second layer to form a PiN diode, wherein a height of the i-layer can be configured to set a breakdown voltage of the semiconductor device.

13. The method of claim 12, wherein the first set of fins and the second set of fins are p-type doped.

14. The method of claim 12, wherein the silicide layer is formed between fins of the first set of fins and fins of the second set of fins.

15. The method of claim 12, wherein the first layer is an n-well, wherein one or more p-type wells are formed in the n-well.

16. A semiconductor device comprising:
    a first set of semiconductor fins vertically extending from a substrate;
    a second set of semiconductor fins vertically extending from the substrate;
    a PN junction formed by a first layer and a second layer, wherein a length of the PN junction is defined by the first set of semiconductor fins and the second set of semiconductor fins;
    a first metal contact coupled to the first layer; and
    a second metal contact atop the second layer, wherein an i-layer is disposed between the first layer and the second layer, wherein a length of the i-layer is defined by the first set of semiconductor fins and the second semiconductor fins.

17. The semiconductor device of claim 16 wherein the first layer, is an ion implantation layer that has a doping concentration of at least to $10^{19}$ cm$^3$.

18. The semiconductor device of claim 16, wherein the first layer has a doping concentration of less than $10^{18}$ cm$^3$.

\* \* \* \* \*